US012805290B2

(12) United States Patent
Yang et al.

(10) Patent No.: US 12,805,290 B2
(45) Date of Patent: Nov. 17, 2026

(54) CHIP STRUCTURE WITH CONDUCTIVE VIA STRUCTURE

(71) Applicant: Taiwan Semiconductor Manufacturing Company, Ltd., Hsinchu (TW)

(72) Inventors: Ting-Li Yang, Tainan City (TW); Po-Hao Tsai, Taoyuan City (TW); Ching-Wen Hsiao, Hsinchu City (TW); Hong-Seng Shue, Zhubei City (TW); Yu-Tse Su, Chiayi City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 274 days.

(21) Appl. No.: 17/874,048

(22) Filed: Jul. 26, 2022

(65) Prior Publication Data

US 2022/0367347 A1 Nov. 17, 2022

Related U.S. Application Data

(62) Division of application No. 17/142,809, filed on Jan. 6, 2021, now Pat. No. 11,908,790.

(51) Int. Cl.
*H10W 20/42* (2026.01)
*H10W 20/00* (2026.01)
(Continued)

(52) U.S. Cl.
CPC ......... *H10W 20/42* (2026.01); *H10W 20/056* (2026.01); *H10W 20/43* (2026.01);
(Continued)

(58) Field of Classification Search
CPC ............. H01L 23/5226; H01L 21/4853; H01L 21/486; H01L 21/76877; H01L 23/528;
(Continued)

(56) References Cited

U.S. PATENT DOCUMENTS

2004/0007779 A1 1/2004 Arbuthnot et al.
2007/0063352 A1 3/2007 Archer, III et al.
(Continued)

OTHER PUBLICATIONS

U.S. Notice of Allowance for U.S. Appl. No. 17/142,809, dated Oct. 19, 2023.
(Continued)

*Primary Examiner* — Kretelia Graham
*Assistant Examiner* — Adin Hrnjic
(74) *Attorney, Agent, or Firm* — Birch, Stewart, Kolasch & Birch, LLP

(57) ABSTRACT

A chip structure is provided. The chip structure includes a substrate. The clip structure includes a conductive line over the substrate. The chip structure includes a first passivation layer over the substrate and the conductive line. The chip structure includes a conductive pad over the first passivation layer covering the conductive line. The conductive pad is thicker and wider than the conductive line. The chip structure includes a first conductive via structure and a second conductive via structure passing through the first passivation layer and directly connected between the conductive pad and the conductive line. The chip structure includes a conductive pillar over the conductive pad.

20 Claims, 41 Drawing Sheets

(51) Int. Cl.
*H10W 20/43* (2026.01)
*H10W 70/05* (2026.01)
*H10W 72/20* (2026.01)

(52) U.S. Cl.
CPC ....... *H10W 70/093* (2026.01); *H10W 70/095* (2026.01); *H10W 72/20* (2026.01)

(58) Field of Classification Search
CPC ........... H01L 24/14; H01L 2224/02333; H01L 2224/13024; H01L 2224/13028
See application file for complete search history.

(56) References Cited

U.S. PATENT DOCUMENTS

| | | | | |
|---|---|---|---|---|
| 2008/0081459 | A1* | 4/2008 | Lee | H01L 24/05 438/624 |
| 2010/0187687 | A1 | 7/2010 | Liu et al. | |
| 2010/0244220 | A1 | 9/2010 | Chou et al. | |
| 2010/0263913 | A1 | 10/2010 | Daubenspeck et al. | |
| 2010/0283149 | A1 | 11/2010 | Chen et al. | |
| 2012/0133379 | A1 | 5/2012 | Chou et al. | |
| 2013/0134594 | A1 | 5/2013 | Machida | |
| 2013/0256893 | A1 | 10/2013 | Tsai et al. | |
| 2013/0320524 | A1 | 12/2013 | Chuang et al. | |
| 2014/0117564 | A1* | 5/2014 | Yu | H01L 23/49894 257/774 |
| 2015/0145120 | A1* | 5/2015 | Lee | H01L 24/14 257/737 |
| 2016/0027754 | A1* | 1/2016 | Katagiri | H10W 90/701 257/737 |
| 2016/0351520 | A1* | 12/2016 | Jiang | H01L 24/13 |
| 2017/0179059 | A1 | 6/2017 | Yao et al. | |
| 2017/0229386 | A1 | 8/2017 | Liang et al. | |
| 2017/0317040 | A1 | 11/2017 | Liang et al. | |
| 2018/0033750 | A1 | 2/2018 | Huang et al. | |
| 2018/0151493 | A1 | 5/2018 | Ku et al. | |
| 2019/0027450 | A1* | 1/2019 | Choi | H01L 24/03 |
| 2019/0221445 | A1* | 7/2019 | Chiu | H01L 23/49827 |
| 2020/0176397 | A1* | 6/2020 | Liu | H01L 23/562 |
| 2020/0312806 | A1* | 10/2020 | Takei | H01L 23/3114 |
| 2020/0343206 | A1* | 10/2020 | Pang | H01L 24/03 |
| 2020/0411467 | A1 | 12/2020 | Yang et al. | |

OTHER PUBLICATIONS

U.S. Office Action for U.S. Appl. No. 17/142,809, dated Jan. 11, 2023.

* cited by examiner

CHIP STRUCTURE WITH CONDUCTIVE VIA STRUCTURE

CROSS REFERENCE

This application is a Divisional of U.S. application Ser. No. 17/142,809, filed on Jan. 6, 2021, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1J-1 is a top view of a region of the chip structure of FIG. 1J, in accordance with some embodiments.

DETAILED DESCRIPTION

Figure 1A:
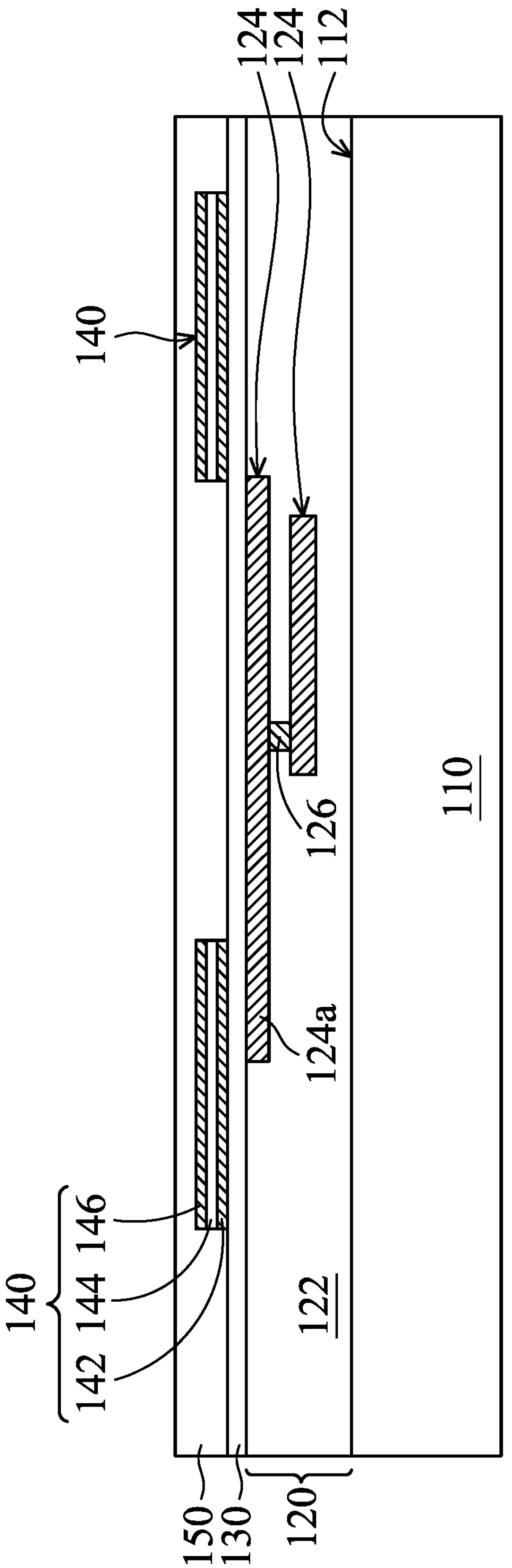
FIGS. 1A-1J are cross-sectional views of various stages of a process for forming a chip structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term"substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below n be replaced or eliminated for different embodiments. Although some embodiments are discussed with operations performed in a particular order, these operations may be performed in another logical order.

FIGS. 1A-1J are cross-sectional views of various stages of a process for forming a chip structure, in accordance with some embodiments. As shown in FIG. 1A, a substrate 110 is provided, in accordance with some embodiments. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an interconnect structure 120 is formed over the substrate 110, in accordance with some embodiments. The interconnect structure 120 includes a dielectric structure 122, wiring layers 124, and conductive vias 126, in accordance with some embodiments. The dielectric structure 122 is formed over a surface 112 of the substrate 110, in accordance with some embodiments. The wiring layers 124 and the conductive vias 126 are formed in the dielectric structure 122, in accordance with some embodiments. Each wiring layer 124 includes conductive lines 124*a*, in accordance with some embodiments.

The conductive vias 126 are electrically connected between different wiring layers 124 and between the wiring layer 124 and the aforementioned device elements, in accordance with some embodiments. The dielectric structure 122 is made of an oxide-containing material (e.g. silicon oxide or undoped silicate glass) or another suitable insulating material, in accordance with some embodiments. The wiring layers 124 and the conductive vias 126 are made of conductive materials such as metal (e.g., aluminum, copper or tungsten) or alloys thereof, in accordance with some embodiments.

As shown in FIG. 1A, a passivation layer 130 is formed over the interconnect structure 120, in accordance with some embodiments. The passivation layer 130 is made of a dielectric material, such as silicon nitride, silicon oxynitride, silicon oxide, or undoped silicate glass (USG), in accordance with some embodiments. The passivation layer 130 is formed using a deposition process (e.g., a chemical vapor deposition process or a physical vapor deposition process), in accordance with some embodiments.

As shown in FIG. 1A, metal-insulator-metal (MIM) capacitors 140 are formed over the passivation layer 130, in accordance with some embodiments. Each MIM capacitor 140 includes a bottom metal layer 142, an insulating layer 144, and a top metal layer 146, in accordance with some embodiments. The insulating layer 144 is sandwiched between the bottom metal layer 142 and the top metal layer 146, in accordance with some embodiments.

The bottom metal layer 142 and the top metal layer 146 are made of titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W), or tungsten (W) alloy, in accordance with some embodiments. The bottom metal layer 142 and the top metal layer 146 are formed by a procedure including depositing, photolithography, and etching processes.

The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking), in accordance with some embodiments. The etching processes include dry etching, wet etching, and/or other etching methods.

The insulating layer 144 is made of dielectric materials, such as silicon oxide, silicon nitride or silicon glass. In some embodiments, the insulating layer 144 is formed by a chemical vapor deposition (CVD) process or physical vapor deposition (PVD) process.

As shown in FIG. 1A, a passivation layer 150 is formed over the passivation layer 130 and the MIM capacitors 140, in accordance with some embodiments. The passivation layer 150 is made of a dielectric material, such as silicon nitride, silicon oxynitride, silicon oxide, or uncoped silicate glass (USG), in accordance with some embodiments. The passivation layer 150 is formed using a deposition process (e.g., a chemical vapor deposition process or a physical vapor deposition process), in accordance with some embodiments.

Figure 1B:
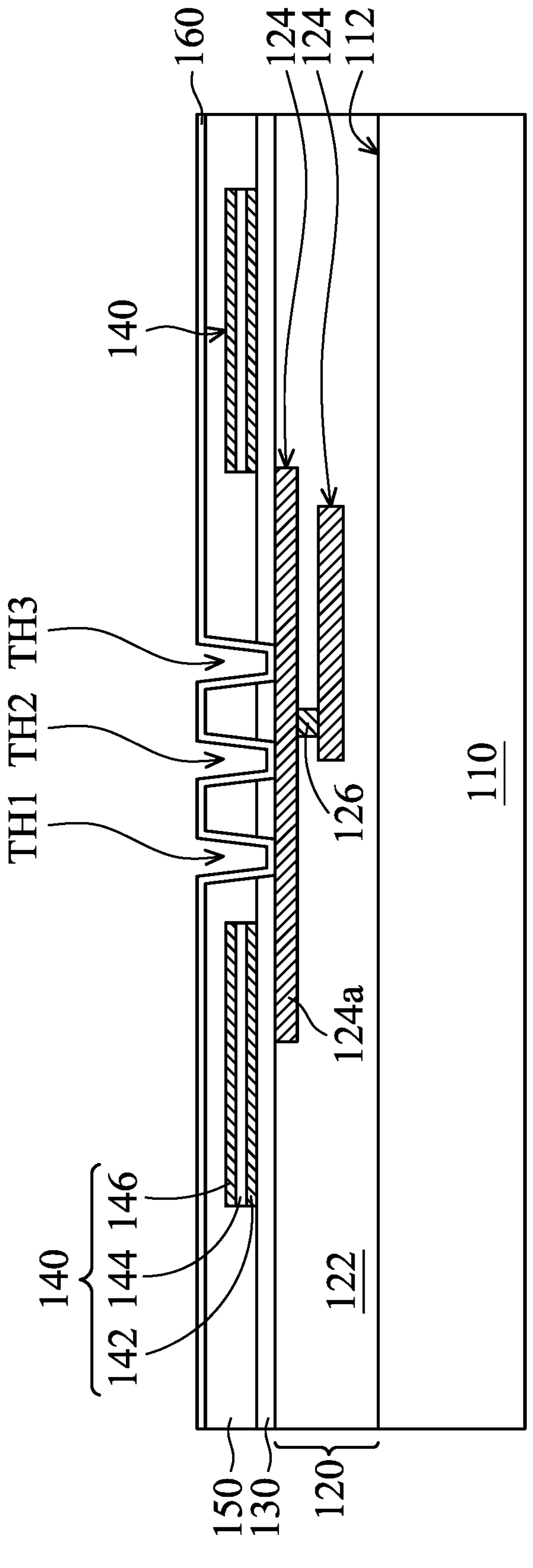

As shown in FIG. 1B, portions of the passivation layers 130 and 150 are removed to form through holes TH1, TH2, and TH3 in the passivation layers 130 and 150, in accordance with some embodiments. The through holes TH1, TH2, and TH3 expose portions of the conductive line 124*a* of the topmost wiring layer 124, in accordance with some embodiments. The removal process includes a photolithography process and an etching process, such as a dry etching process, in accordance with some embodiments.

In some embodiments (not shown), a barrier layer is formed over the passivation layer 150 and in the through holes TH1, TH2, and TH3. The barrier layer is made of nitrides such as tantalum nitride (TaN), in accordance with some embodiments. In some embodiments, the barrier layer is a multilayer structure including a tantalum layer and a tantalum nitride layer over the tantalum layer. The barrier layer is formed using a deposition process, such as a physical vapor deposition (PVD) process, a chemical vapor deposition (CVD) process, or an atomic layer deposition (ALD) process, in accordance with some embodiments.

As shown in FIG. 1B, a seed layer 160 is conformally formed over the barrier layer, in accordance with some embodiments. In some embodiments, the barrier layer is not formed. The seed layer 160 is made of a conductive material, such as metal (e.g., copper, aluminum, gold, silver, tungsten, titanium, cobalt, or ruthenium) or alloys thereof, in accordance with some embodiments. The seed layer 160 is formed using a deposition process, such as a physical vapor deposition (PVD) process, a chemical vapor deposition (CVD) process, or an atomic layer deposition (ALD) process, in accordance with some embodiments.

Figure 1C:
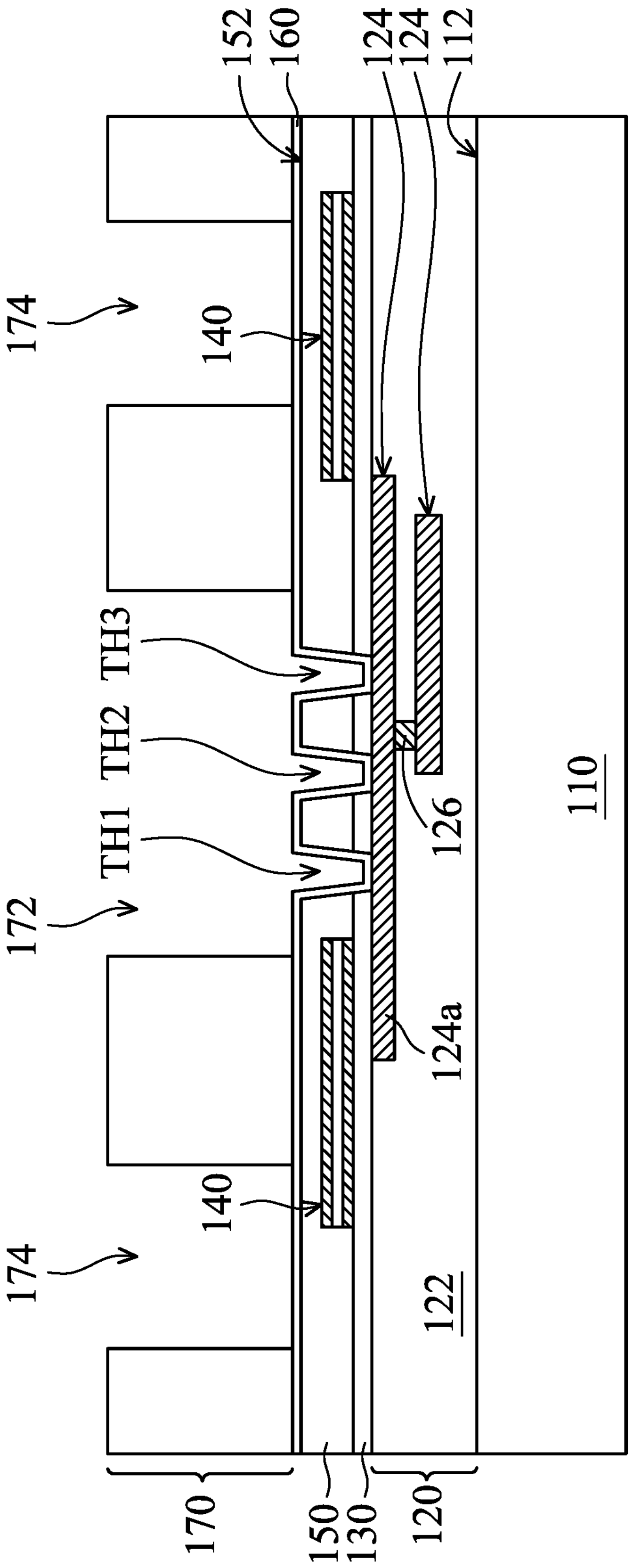

As shown in FIG. 1C, a mask layer 170 is formed over the seed layer 160, in accordance with some embodiments. The mask layer 170 has an opening 172 and trenches 174 exposing portions of the seed layer 160, in accordance with some embodiments. The opening 172 exposes a portion of the seed layer 160 in the through holes TH1, TH2, and TH3 and a portion of the seed layer 160 over a top surface 152 of the passivation layer 150, in accordance with some embodiments. The mask layer 170 is made of a polymer material, such as a photoresist material, in accordance with some embodiments.

After the mask layer 170 is formed, a descum process is performed over the seed layer 160 exposed by the opening 172 and the trenches 174 to remove the residues over the seed layer 160, in accordance with some embodiments. The descum process includes an etching process such as a plasma etching process, in accordance with some embodiments.

Figure 1D:
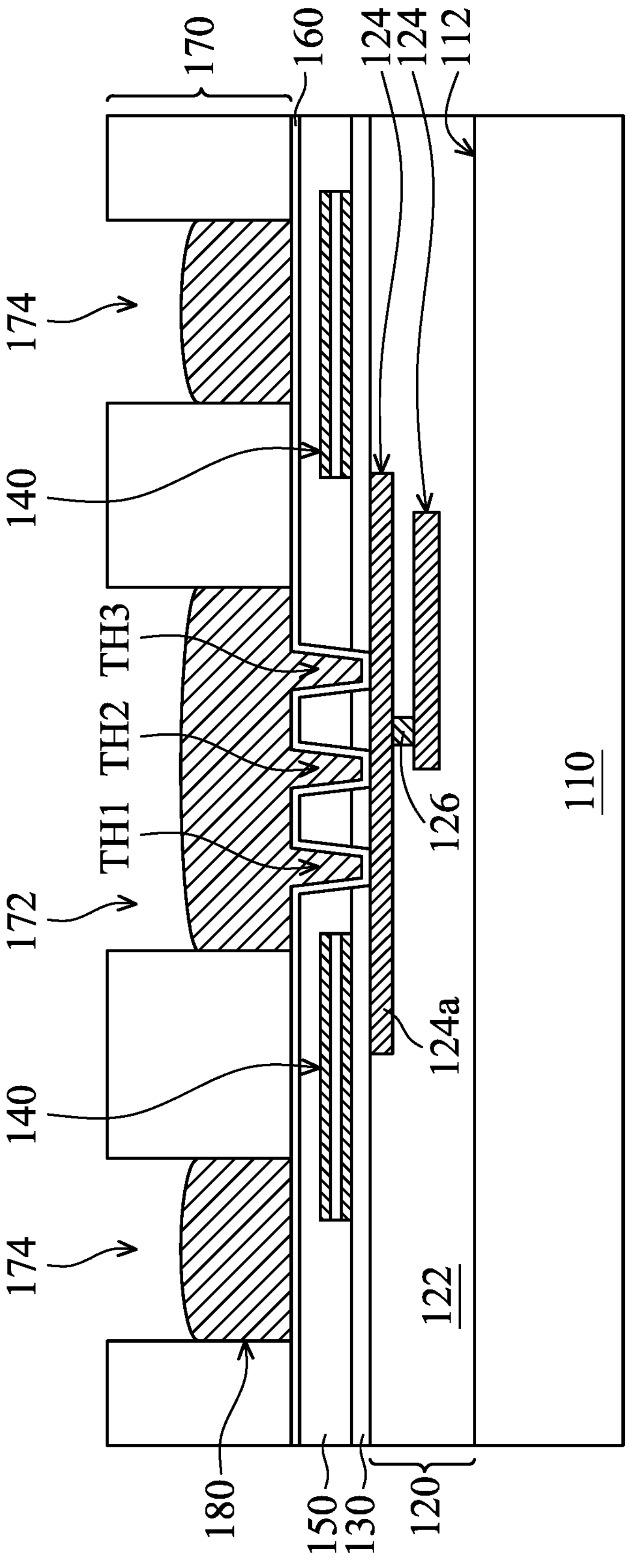

As shown in FIG. 1D, a conductive layer 180 is formed over the seed layer 160 exposed by the opening 172 and the trenches 174, in accordance with some embodiments. The conductive layer 180 is made of a conductive material, such as metal (e.g., copper) or alloys thereof, in accordance with some embodiments. The conductive layer 180 is formed by a plating process, such as an electroplating process, in accordance with some embodiments.

Figure 1E:
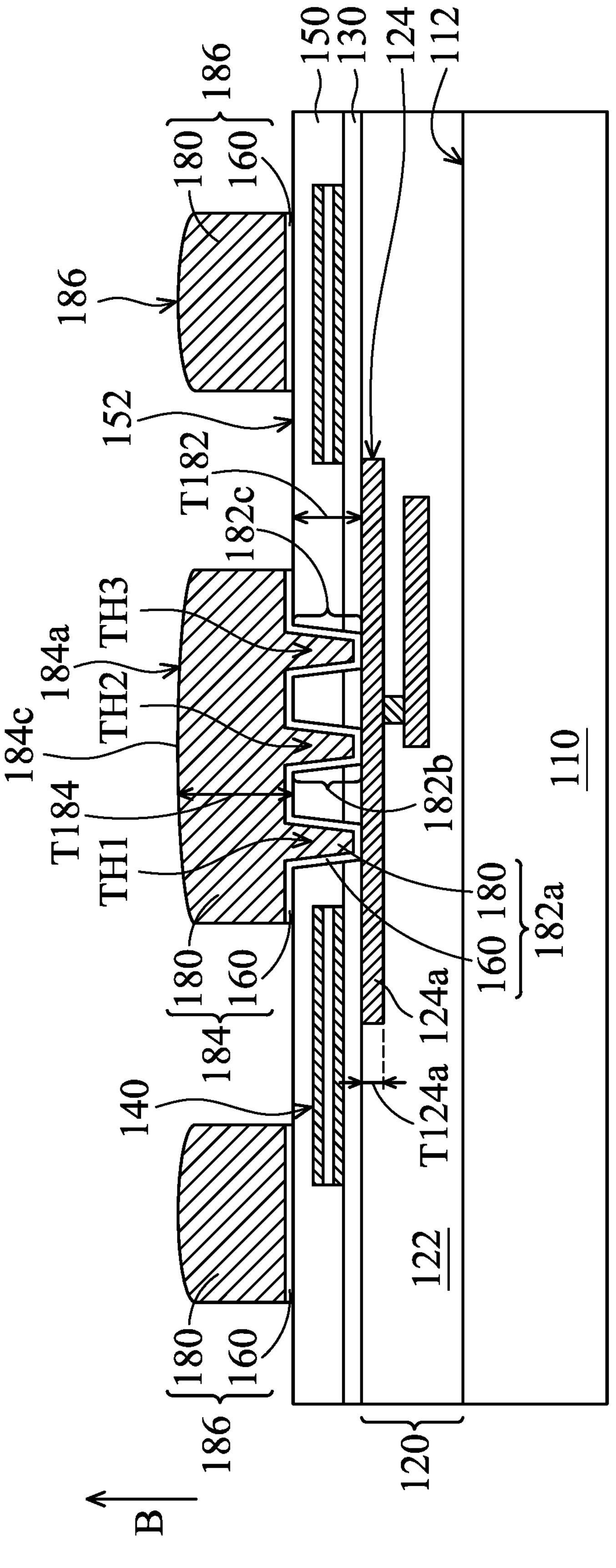
Figure 1F:
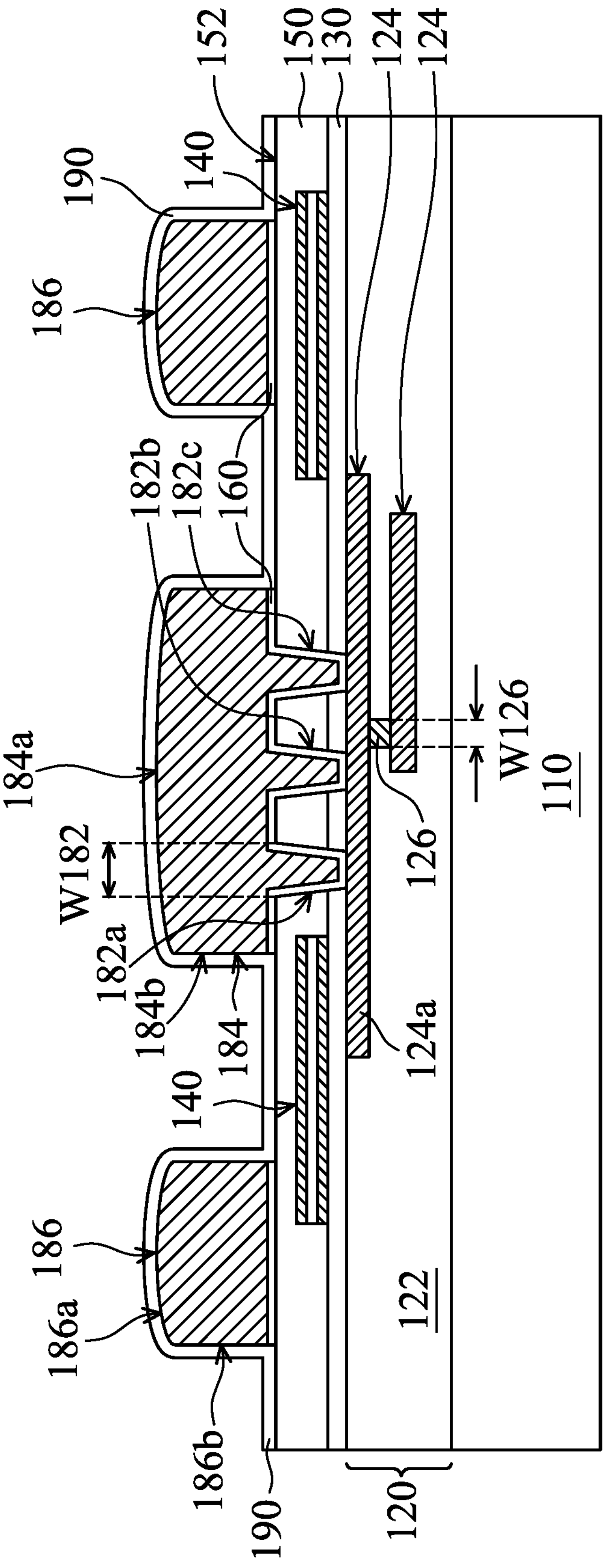

As shown in FIG. 1E, the mask layer 170 is removed, in accordance with some embodiments. As shown in FIG. 1F, the seed layer 160 originally under the mask layer 170 is removed, in accordance with some embodiments. The removal process includes an etching process such as a wet etching process, in accordance with some embodiments. The barrier layer (not shown), which is not covered by the conductive layer 180, is removed, in accordance with some embodiments. The removal process includes an etching process such as a dry etching process or a wet etching process, in accordance with some embodiments.

As shown in FIGS. 1D and 1E, the conductive layer 180, originally in the opening 172, and the seed layer 160 thereunder together form a conductive pad 184, in accordance with some embodiments. The conductive layer 180, originally in the trenches 174, and the seed layer 160 thereunder together form conductive lines 186, in accordance with some embodiments. The conductive layer 180 in the through holes TH1, TH2, and TH3 and the seed layer 160 thereunder together form conductive via structures 182*a*, 182*b*, and 182*c*, in accordance with some embodiments.

The conductive pad 184 is thicker than the conductive line 124*a*, in accordance with some embodiments. That is, a thickness T184 of the conductive pad 184 is greater than a thickness T124*a* of the conductive line 124*a*, in accordance with some embodiments. The conductive pad 184 is thicker than the conductive via structure 182*a*, 182*b*, or 182*c*, in accordance with some embodiments. That is, the thickness 1184 of the conductive pad 184 is greater than a thickness T182 of the conductive via structure 182*a*, 182*b*, or 182*c*, in accordance with some embodiments. The thickness 1184 ranges from about 2 μm to about 6 μm, in accordance with some embodiments. The thickness T184 ranges from about 2 μm to about 7 μm, in accordance with some embodiments.

The thickness T182 ranges from about 0.1 μm to about 1 μm, in accordance with some embodiments. The thickness T182 ranges from about 0.2 μm to about 0.6 μm, in accordance with some embodiments. In some embodiments, the thickness T184 is greater than the sum of the thicknesses T182 and T124*a* of the conductive via structure 182*a*, 182*b*, or 182*c* and the conductive line 124*a*.

The conductive pad 184 has a top surface 184*a*, in accordance with some embodiments. Since the electroplating process for forming the conductive layer 180 of the conductive pad 184 has good hole-filling ability, the top surface 184*a* does not has small recesses respectively over the through holes TH1, TH2, and TH3 (or the conductive via structures 182*a*, 182*b*, and 182*c*), in accordance with some embodiments. Since stress tends to concentrate around the small recesses, the electroplating process, which has good hole-filling ability, prevents stress from concentrating over the conductive via structures 182*a*, 182*b*, and 182*c*, in accordance with some embodiments. That is, the roughness of the top surface 184*a* is reduced by the electroplating process, in accordance with some embodiments.

In some embodiments, the top surface 184*a* is a convex top surface (or a dome surface). The conductive via structures 182*a*, 182*b* and 182*c* are under the top surface 184*a* (i.e., the convex top surface), in accordance with some embodiments.

The conductive via structures 182*a*, 182*b* and 182*c* pass through the passivation layers 130 and 150, in accordance with some embodiments. The conductive via structures 182*a*, 182*b* and 182*c* are directly connected between the conductive pad 184 and the conductive line 124*a* thereunder, in accordance with some embodiments.

The conductive via structure 182*a* or 182*c* and a center portion 184*c* of the conductive pad 184 are misaligned in a direction B perpendicular to the top surface 112 of the substrate 110, in accordance with some embodiments. The center portion 184*c* is between the conductive via structures 182*a* and 182*c*, in accordance with some embodiments.

The conductive via structure 182*b* and the center portion 184*c* are aligned with each other in the direction B, in accordance with some embodiments. That is, the conductive via structure 182*b* is under the center portion 184*c*, in accordance with some embodiments. The conductive via structure 182*b* is connected between the conductive line 124*a* and the center portion 184*c*, in accordance with some embodiments. In some embodiments, the conductive via structures 182*a*, 182*b*, and 182*c* have a trapezoid shape.

As shown in FIG. 1F, a passivation layer 190 is conformally formed over the passivation layer 150, the conductive pad 184, and the conductive lines 186, in accordance with some embodiments. The passivation layer 190 conformally covers the top surface 184*a* and sidewalk 184*b* of the conductive pad 184, a top surface 186*a* and sidewalls 186*b* of each conductive line 186, and the top surface 152 of the passivation layer 150, in accordance with some embodiments.

The passivation layer 190 is made of a dielectric material, such as nitrides (e.g., silicon nitride or silicon oxynitride), in accordance with some embodiments. The passivation layer 190 is formed using a deposition process (e.g., a chemical vapor deposition process, a physical vapor deposition process, or an atomic layer deposition process), in accordance with some embodiments. In some embodiments, a width W182 of the conductive via structure 182*a*, 182*b*, or 182*c* is greater than a width W126 of the conductive via 126.

Figure 1G:
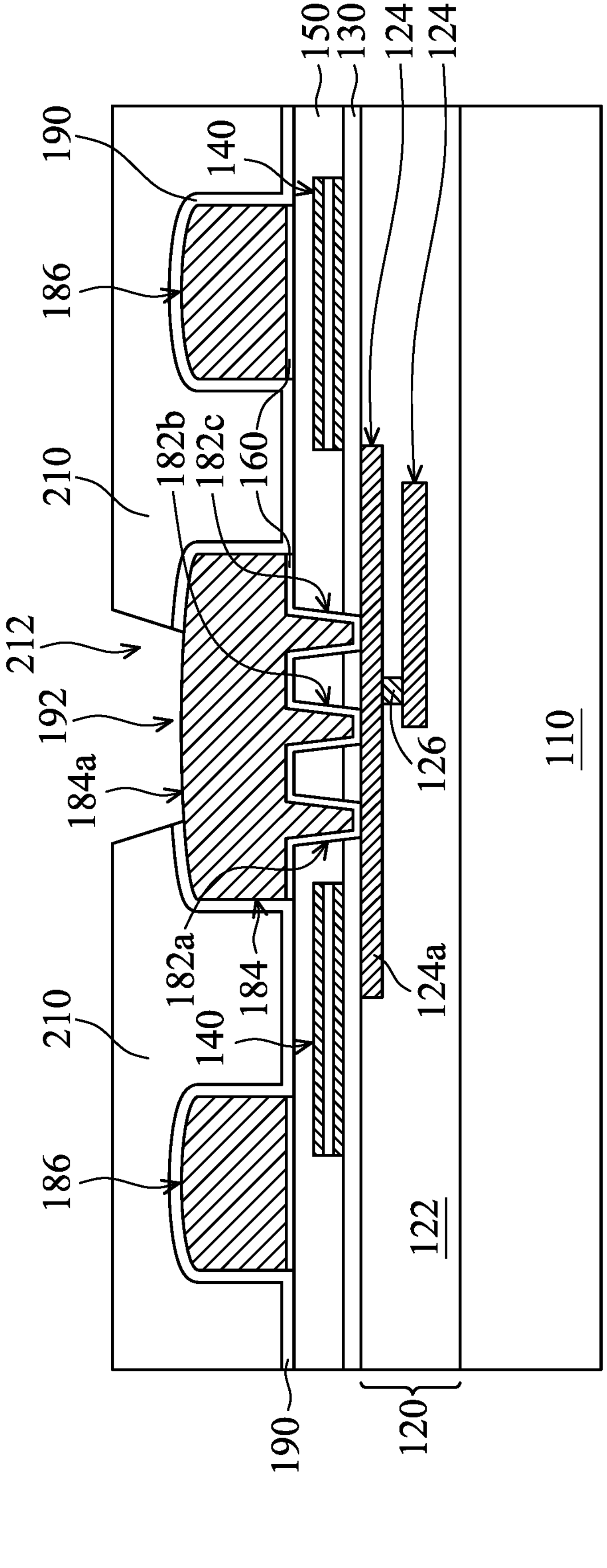

As shown in FIG. 1G, a mask layer 210 is formed over the passivation layer 190, in accordance with some embodiments. The mask layer 210 has an opening 212 exposing a portion of the passivation layer 190 over the conductive pad 184, in accordance with some embodiments. The mask layer 210 is made of a polymer material, such as a photoresist material, in accordance with some embodiments.

As shown in FIG. 1G, the passivation layer 190 exposed by the opening 212 is removed to form an opening 192 in the passivation layer 190, in accordance with some embodiments. The removal process includes an etching process such as a dry etching process or a wet etching process, in accordance with some embodiments.

Figure 1H:
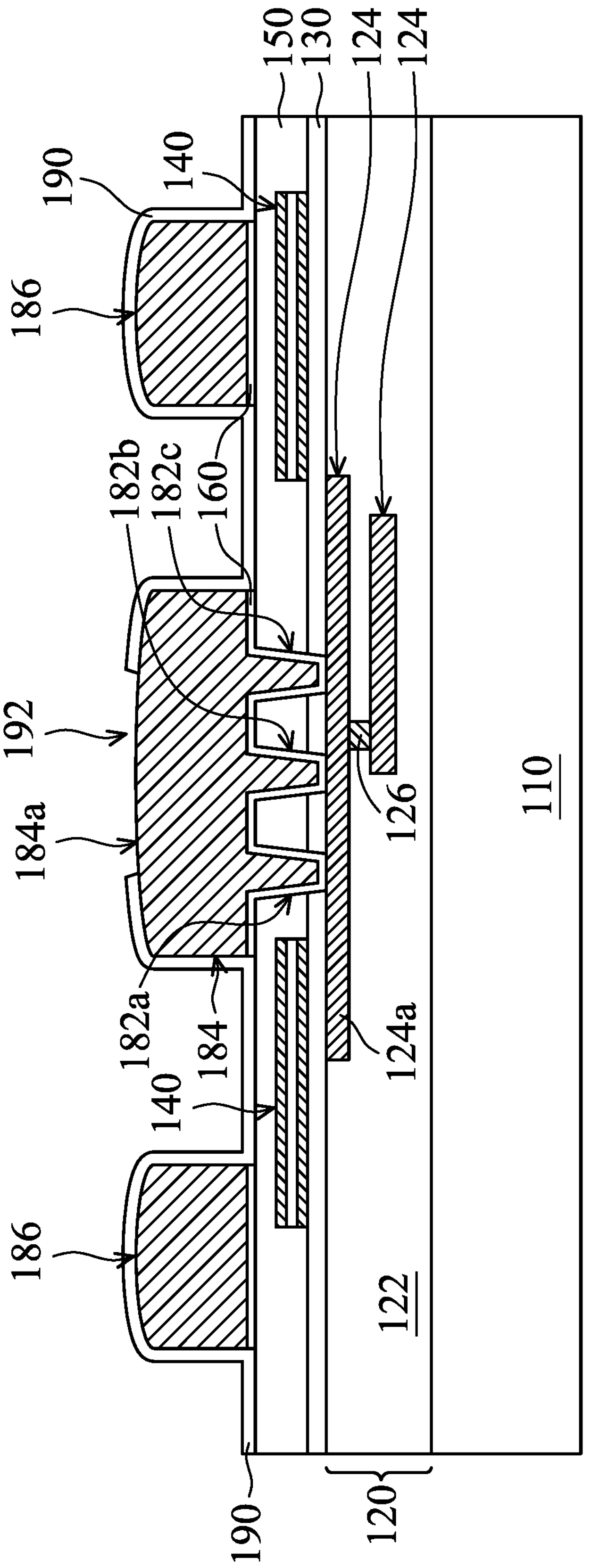

As shown in FIG. 1H, the mask layer 210 is removed, in accordance with some embodiments. The passivation layer 190 overlaps the conductive via structures 182*a* and 182*c*, in accordance with some embodiments. The conductive via structure 182*b* is under the opening 192 of the passivation layer 190, in accordance with some embodiments.

Figure 1I:
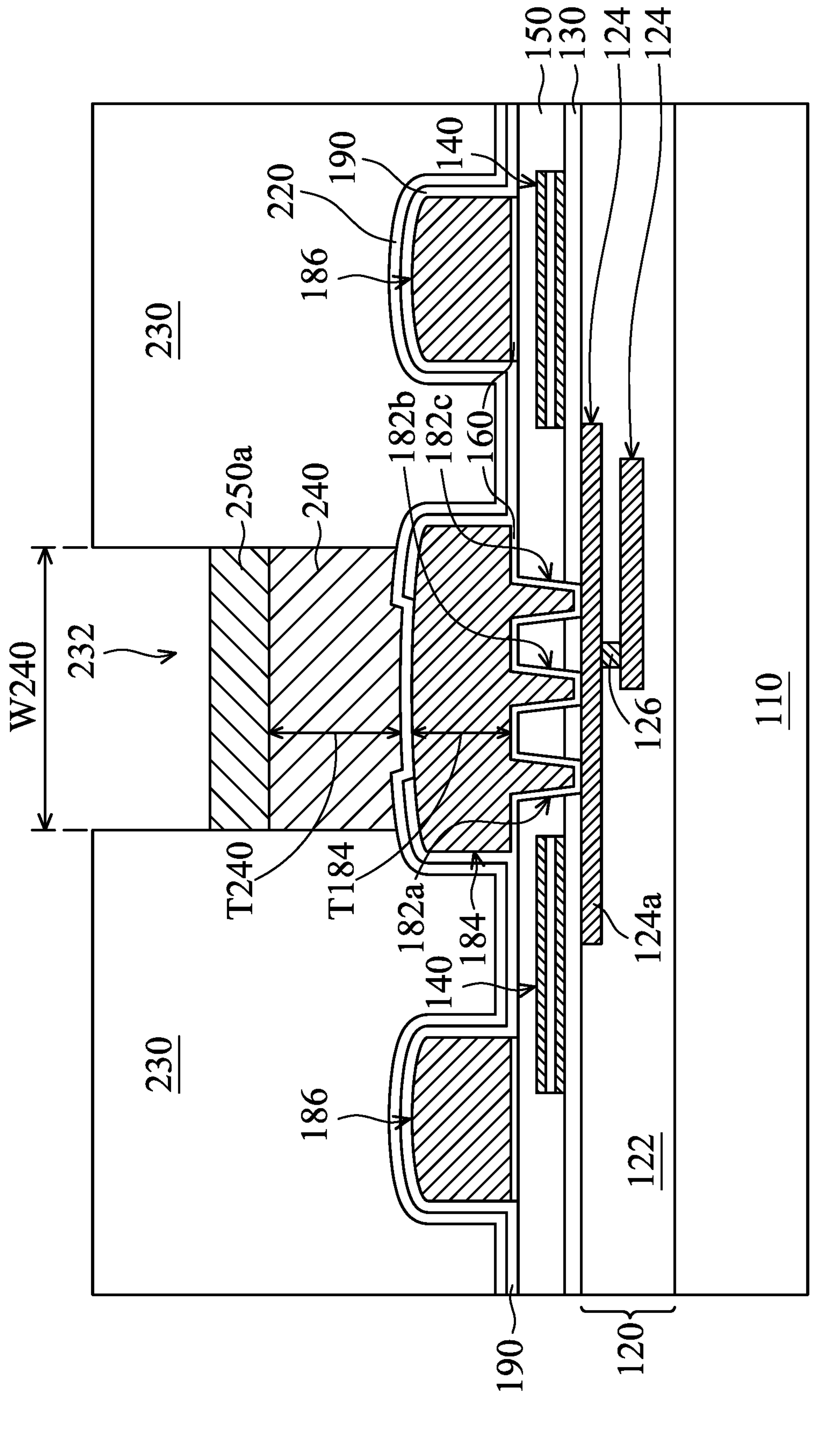

As shown in FIG. 1I, a seed layer 220 is conformally formed over the passivation layer 190 and the conductive pad 184, in accordance with some embodiments. The seed layer 220 is in direct contact with the passivation layer 190 and the conductive pad 184, in accordance with some embodiments. The seed layer 220 is made of a conductive material, such as metal (e.g., copper, aluminum, gold, silver, tungsten, titanium, cobalt, or ruthenium) or alloys thereof, in accordance with some embodiments. The seed layer 220 is formed using a deposition process, such as a physical vapor deposition (PVD) process, a chemical vapor deposition (CVD) process, or an atomic layer deposition (ALD) process, in accordance with some embodiments. The conductive pad 184 has a thickness T184 ranging from about 2 μm to about 10 μm, in accordance with some embodiments.

As shown in FIG. 1I, a mask layer 230 is formed over the seed layer 220, in accordance with some embodiments. The mask layer 230 has an opening 232 exposing a portion of the seed layer 220 over the conductive pad 184, in accordance with some embodiments. The mask layer 230 is made of a polymer material, such as a photoresist material, in accordance with some embodiments.

As shown in FIG. 1I, a conductive layer 240 is formed over the seed layer 220 exposed by the opening 232, in accordance with some embodiments. The conductive layer 240 is made of a conductive material, such as metal (e.g., titanium, copper, nickel, or aluminum) or alloys thereof, in accordance with some embodiments. The conductive layer 240 is formed using a plating process, such as an electroplating process, in accordance with some embodiments.

The conductive layer 240 has a thickness T240 ranging from about 5 μm to about 17 μm, in accordance with some embodiments. The conductive layer 240 has a width W240 ranging from about 5 μm to about 22 μm, in accordance with some embodiments.

As shown in FIG. 1I, a solder layer 250*a* is formed over the conductive layer 240, in accordance with some embodiments. The solder layer 250*a* is made of a conductive material, such as metal (e.g., tin or the like) or alloys thereof, in accordance with some embodiments. The solder layer 250*a* is formed using a plating process, such as an electroplating process, in accordance with some embodiments. In some other embodiments, the solder layer 250*a* is formed using a ball mount process.

Figure 1J:
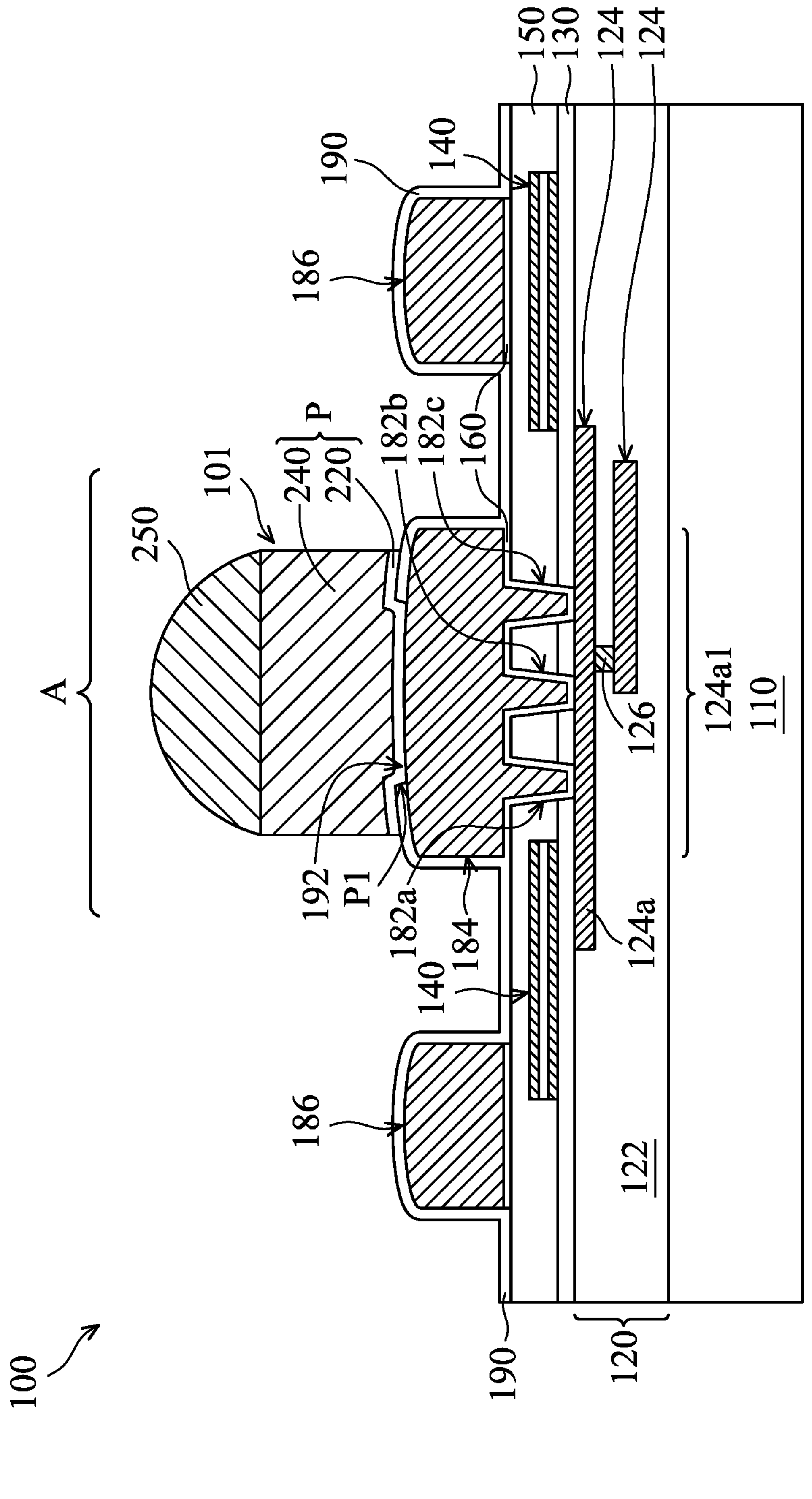
Figures 1, 1J:
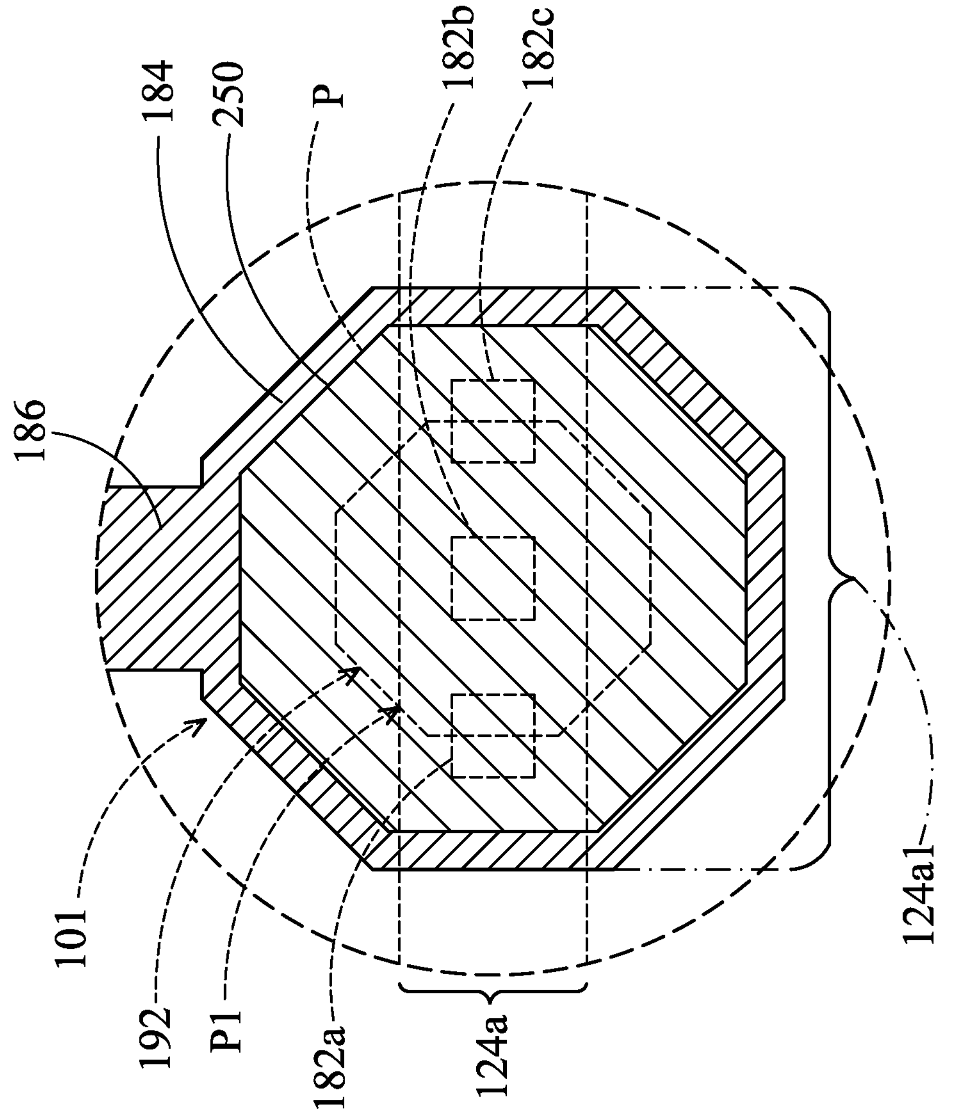

FIG. 1J-1 is a top view of a region A of the chip structure of FIG. 1J, in accordance with some embodiments. As shown in FIGS. 1J and 1J-1, the mask layer 230 is removed, in accordance with some embodiments. As shown in FIGS. 1J and 1J-1, the seed layer 220 originally under the mask layer 230 is removed, in accordance with some embodimentsments. The removal process includes an etching process such as a wet etching process, in accordance with some embodiments.

As shown in FIGS. 1I, 1J, and 1J-1, a reflow process is performed over the solder layer 250*a* to form a solder bump 250, in accordance with some embodiments. In this step, a chip structure 100 is substantially formed, in accordance with some embodiments.

The conductive layer 240 and the seed layer 220 remaining under the conductive layer 240 together form a conductive pillar P, in accordance with some embodiments. The conductive pillar P is over the passivation layer 190 and fills the opening 192, in accordance with some embodiments. The conductive pillar P has a protruding bottom portion P1 passing through the passivation layer 190, in accordance with some embodiments. The conductive via structures 182*a*, 182*b*, and 182*c* are under the protruding bottom portion P1, in accordance with some embodiments.

For the sake of simplicity, FIG. 1J-1 omits depicting the passivation layer 190, in accordance with some embodiments. Similarly, FIGS. 5B, 6B, 7B, 8B, 9-22, 23C and 25 omit depicting the passivation layer 190, in accordance with some embodiments.

As shown in FIG. 1J-1, the conductive pad 184 is wider than the conductive line 124*a*, in accordance with some embodiments. As shown in FIG. 1J-1, the conductive via structures 182*a*, 1821, and 182*c* are arranged along the portion 124*a*1 of the conductive line 124*a* under the conductive pad 184, in accordance with some embodiments. As shown in FIG. 1J-1, the conductive via structures 182*a*, 182*b*, and 182*c* have a square shape, in accordance with some embodiments.

The conductive via structures 182*a*, 182*b*, and 182*c*, the conductive pad 184, the conductive pillar P, and the solder bump 250 together form a conductive connector 101, in accordance with some embodiments. That is, FIG. 1J-1 is a top view of the conductive connector 101 and the conductive line 124*a* of the chip structure 100, in accordance with some embodiments.

The conductive via structures 182*a*, 182*b*, and 182*c* are able to share the bonding stress from the conductive pillar P during a subsequent bonding process for bonding the conductive pillar P to a substrate (not shown) through the solder bump 250, in accordance with some embodiments. Therefore, the conductive via structures 182*a*, 182*b*, and 182*c* are able to prevent the bonding stress from concentrating in only one conductive via structure, which improves the reliability of the chip structure 100, in accordance with some embodiments.

In a portion of the chip structure 100 under the conductive pad 184, the conductive via structures 182*b*, and 182*c* may provide more support force than only one conductive via structure, and therefore the conductive via structures 182*a*, 182*b*, and 182*c* may reduce the bonding stress applied to the passivation layers 130 and 150 under the conductive pad 184, which prevents the passivation layers 130 and 150 from cracking and/or delamination.

Similarly, the conductive via structures 182*a*, 182*b*, and 182*c* are also able to reduce the bonding stress applied to the MIM capacitor 140 under the conductive pad 184, which prevents the MIM capacitor 140 from cracking, in accordance with some embodiments.

If one of the conductive via structures 182*a*, 182*b*, and 182*c* is broken, the others of the conductive via structures 182*a*, 182*b*, and 182*c* may still connected between the conductive pad 184 and the conductive line 124*a*. Therefore, the multiple conductive via structures 182*a*, 182*b*, and 182*c* may improve the reliability of the electrical connection between the conductive pad 184 and the conductive line 124*a*.

The total connection area between the conductive via structures 182*a*, 182*b*, and 182*c* and the conductive pad 184 (or the conductive line 124*a*) is greater than the connection area between only one conductive via structure and the conductive pad 184 (or the conductive line 124*a*), in accordance with some embodiments. Therefore, the formation of the multiple conductive via structures 182*a*, 182*b*, and 182*c* reduces the resistance between the conductive pad 184 and the conductive line 124*a*, which improves the performance of the chip structure 100, in accordance with some embodiments.

Since the total connection area between the conductive pad 184 and the conductive via structures 182*a*, 182*b*, and 182*c* is greater than the connection area between the conductive pad 184 and only one conductive via structure, the formation of the multiple conductive via structures 182*a*, 182*b*, and 18 reduces the electromigration effect and increases the electromigration lifetime, which improves the reliability of the electrical connection between the conductive pad 184 and the conductive line 124*a*, in accordance with some embodiments.

Since the total connection area between the conductive pad 184 and the conductive via structures 182*a*, 182*b*, and 182*c* is greater than the connection area between the conductive pad 184 and only one conductive via structure, the conductive via structures 182*a*, 182*b*, and 182*c* are able to firmly secure the conductive pad 184 to the passivation layer 150, which improves the reliability of the chip structure 100, in accordance with some embodiments.

The material property of copper may reduce the stress migration and the electromigration effect, in accordance with some embodiments. Therefore, if the conductive pad 184 and the conductive via structures 182*a*, 182*b*, and 182*c* are made of copper, the stress migration and the electromigration effect are reduced, in accordance with some embodiments. The electromigration lifetime is increased and the reliability of the chip structure 100 is improved, in accordance with some embodiments.

Figure 2:
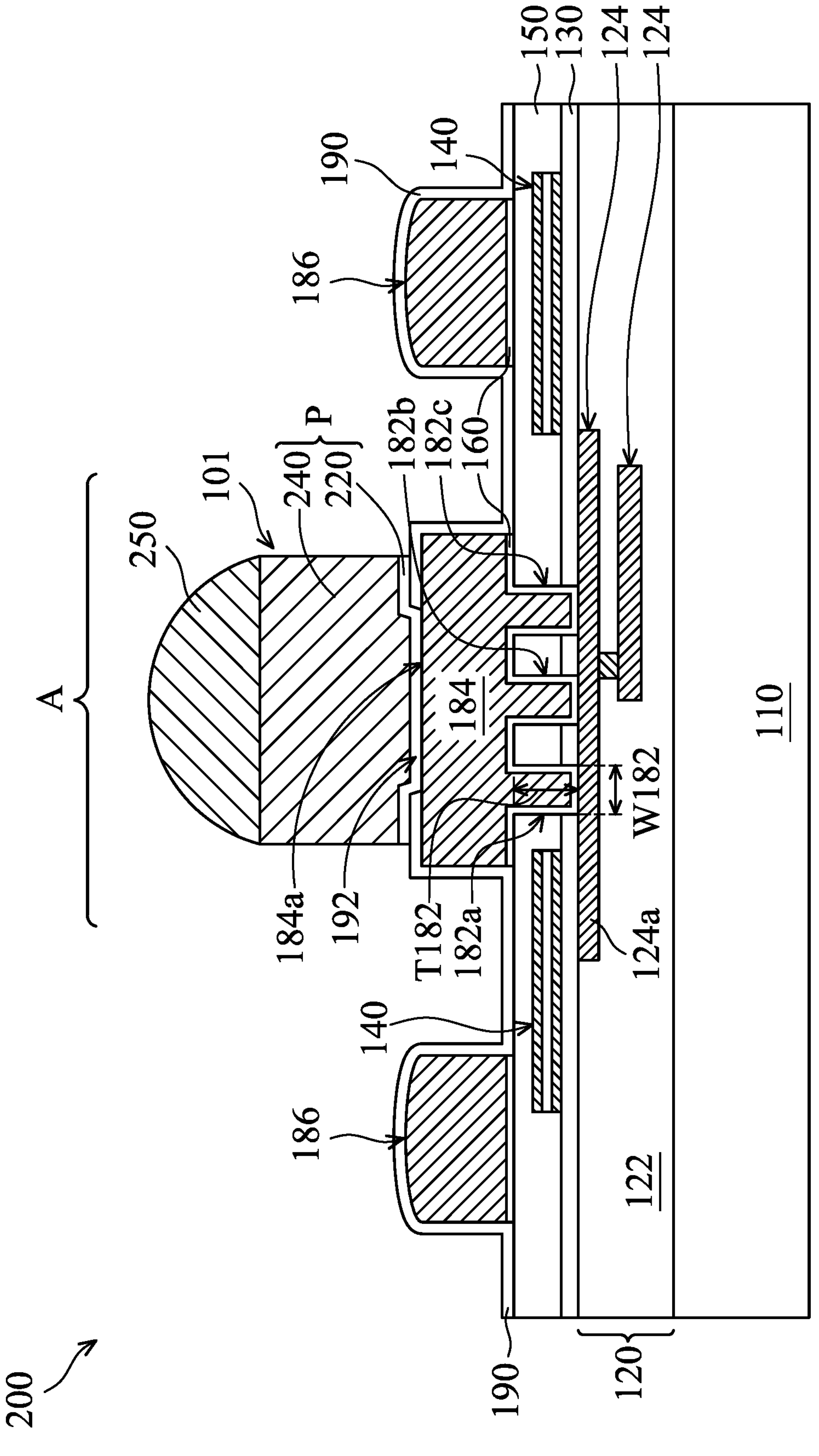
FIG. 2 is a cross-sectional view of a chip structure, in accordance with some embodiments.

FIG. 2 is a cross-sectional view of a chip structure 200, in accordance with some embodiments. As shown in FIG. 2, the chip structure 200 is similar to the chip structure 100 of FIG. 1J, except that the conductive via structures 182*a*, 182*b*, and 182*c* of the chip structure 200 have a rectangle shape, in accordance with some embodiments. That is, the thickness T182 of the conductive via structure 182*a*, 182*b*, or 182*c* is greater than the width W182 of the conductive via structure 182*a*, 182*b*, or 182*c*, in accordance with some embodiments. In some embodiments, the top surface 184*a* of the conductive pad 184 is a flat top surface.

Figure 3:
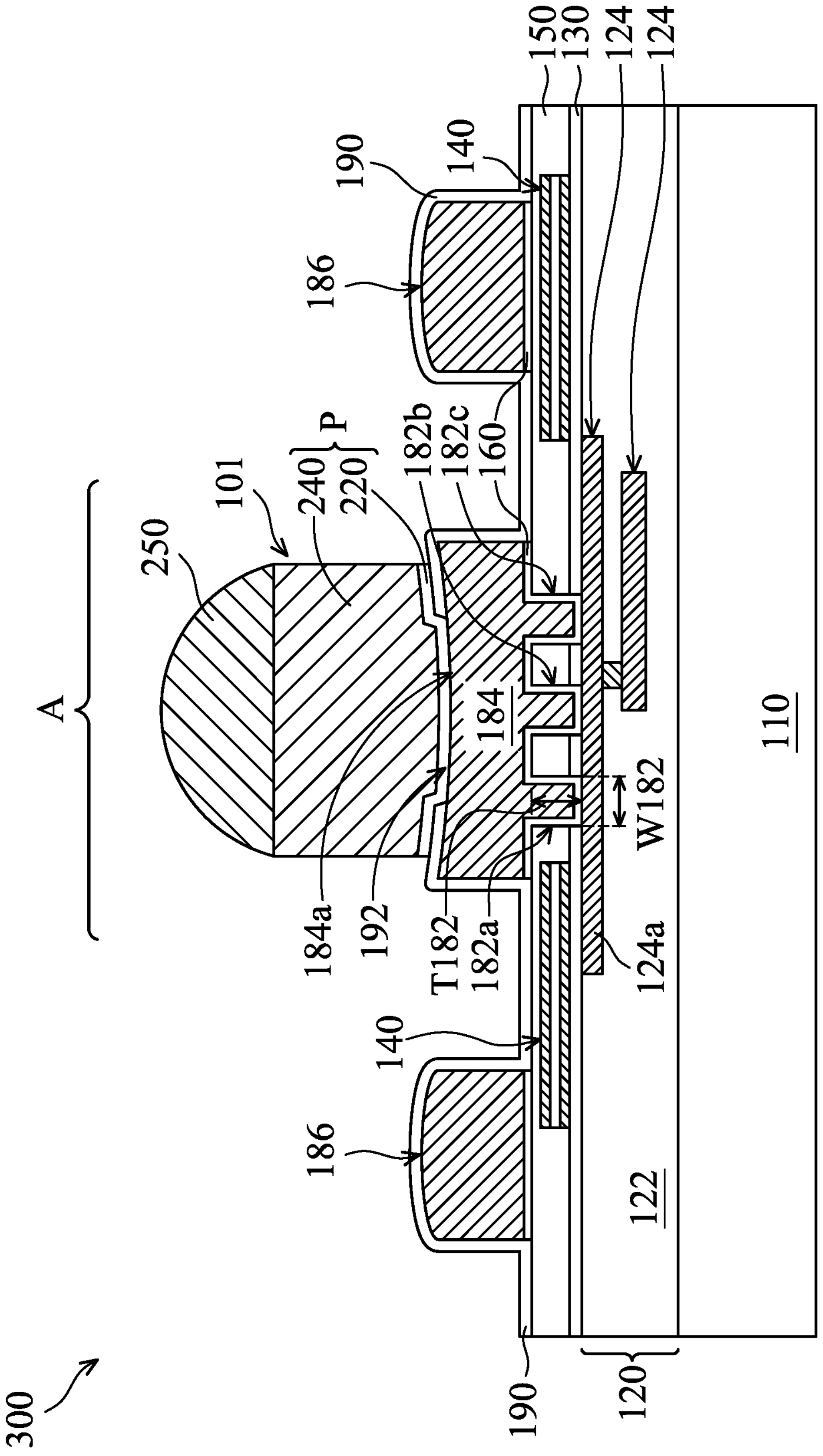
FIG. 3 is a cross-sectional view of a chip structure, in accordance with some embodiments.

FIG. 3 is a cross-sectional view of a chip structure 300, in accordance with some embodiments. As shown in FIG. 3, the chip structure 300 is similar to the chip structure 100 of FIG. 1J, except that the conductive via structures 182*a*, 182*b*, and 182*c* of the chip structure 300 have a square shape, in accordance with some embodiments. That is, the thickness T182 of the conductive via structure 182*a*, 182*b*, or 182*c* is substantially equal to the width W182 of the conductive via structure 182*a*, 182*b*, or 182*c*, in accordance with some embodiments.

In some embodiments, the top surface 184*a* of the conductive pad 184 is a concave top surface. The conductive via structures 182*a*, 182*b*, and 182*c* are under the top surface 184*a* (i.e., the concave top surface), in accordance with some embodiments. In some other embodiments (not shown), the conductive via structures 182*a*, 182*b*, and 182*c* have a polygonal shape such as a hexagonal shape, an octagonal shape, or the like.

Figure 4:
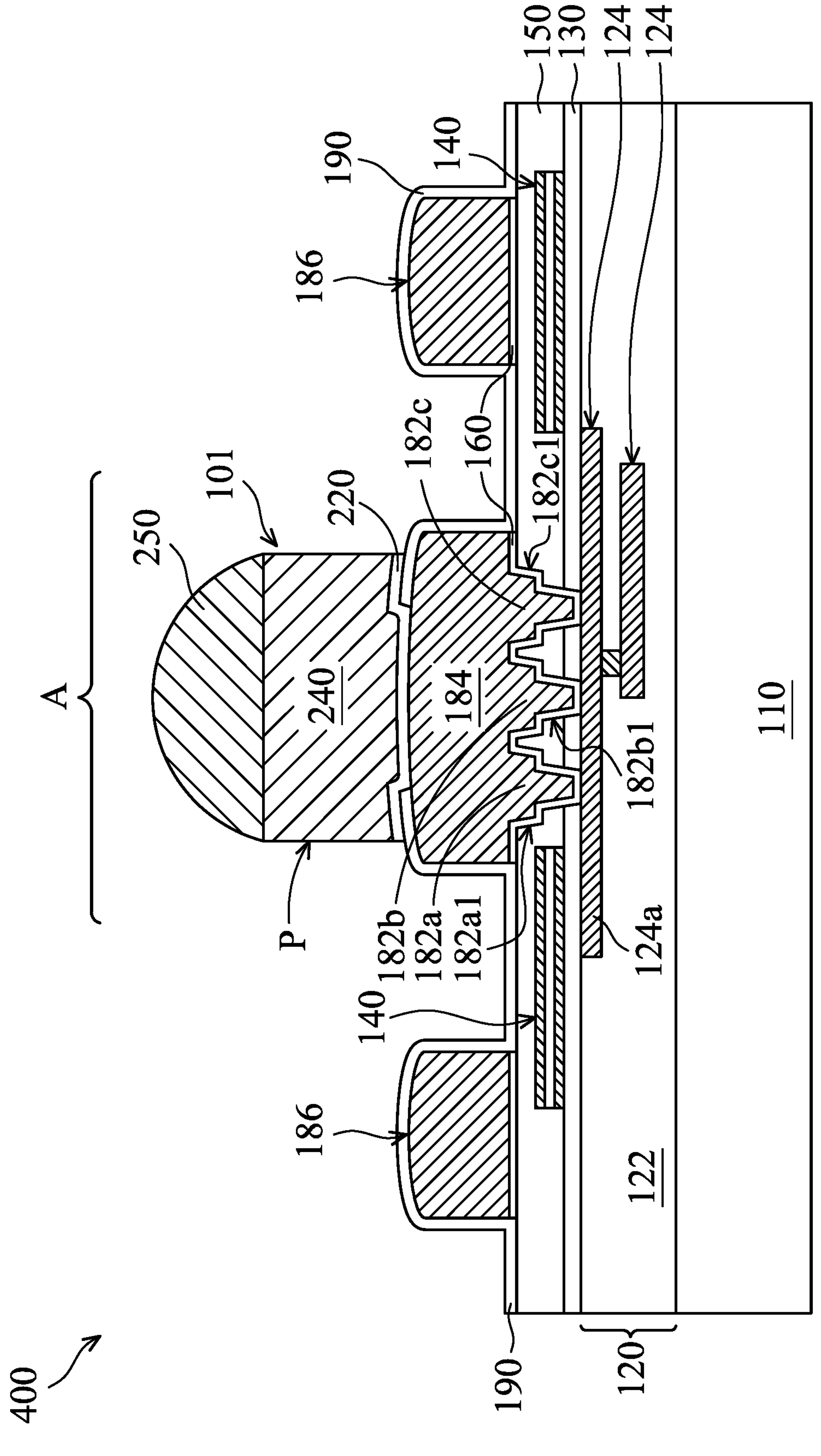
FIG. 4 is a cross-sectional view of a chip structure, in accordance with some embodiments.

FIG. 4 is a cross-sectional view of a chip structure 400, in accordance with some embodiments. As shown in FIG. 4, the chip structure 400 is similar to the chip structure 100 of FIG. 1J, except that the conductive via structures 182*a*, 182*b*, and 182*c* of the chip structure 400 have a ladder-like shape, in accordance with some embodiments. The conductive via structures 182*a*, 182*b*, and 182*c* respectively have ladder-shaped sidewalls 182*a*1, 182*b*1, and 182*c*1, in accordance with some embodiments.

Figure 5A:
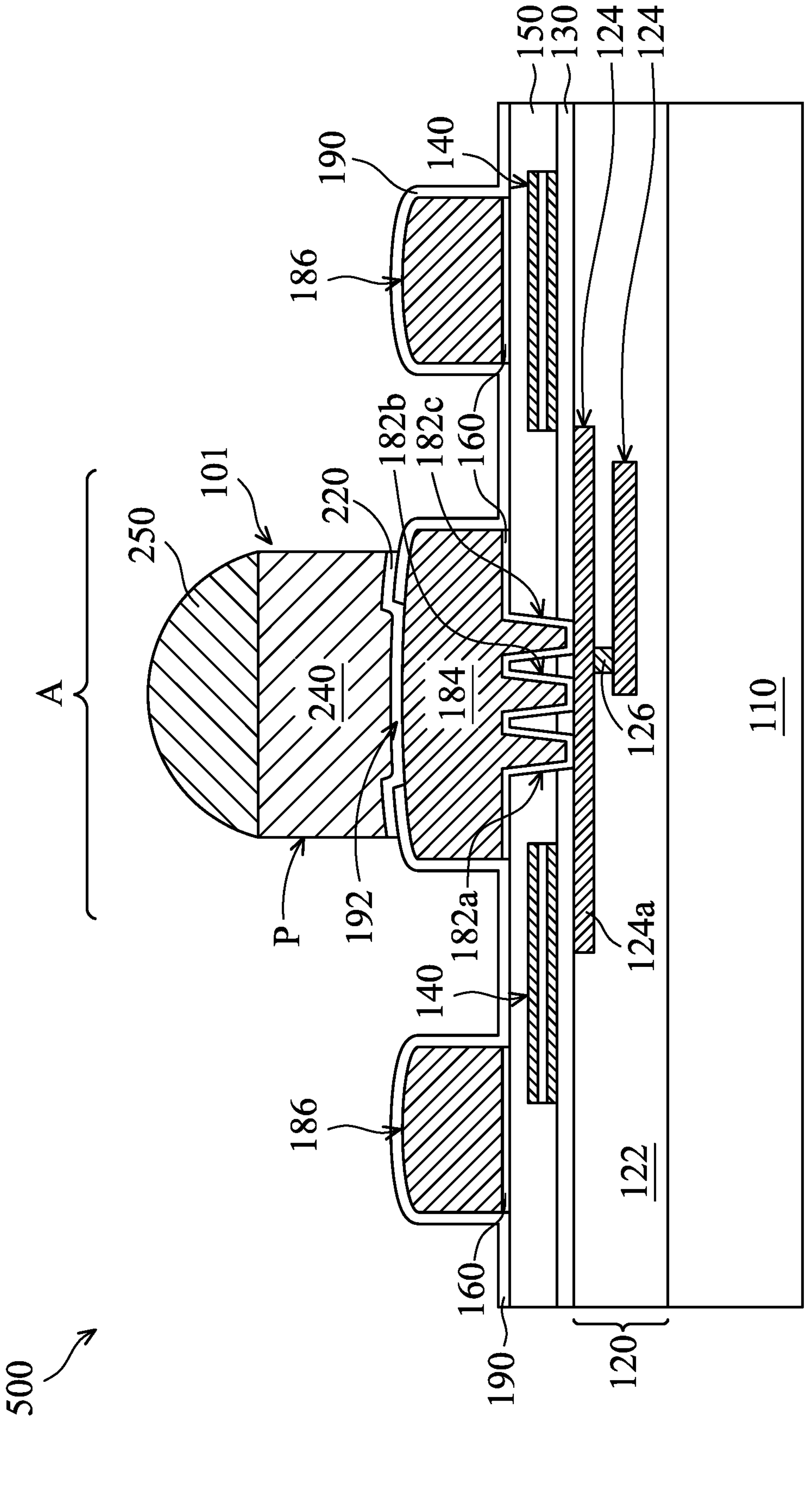
FIG. 5A is a cross-sectional view of a chip structure, in accordance with some embodiments.
Figure 5B:
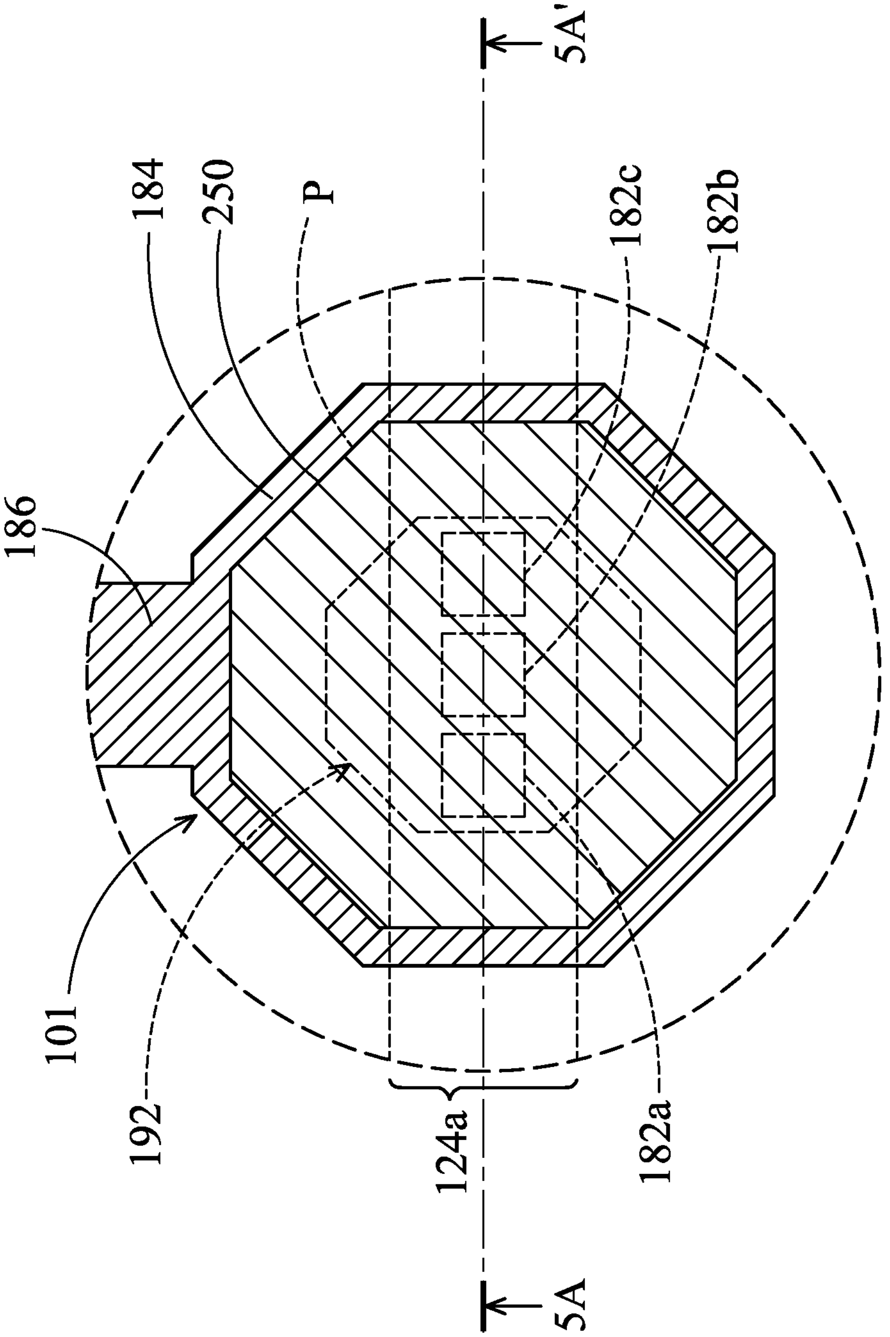
FIG. 5B is a top view of a region of the chip structure of FIG. 5A, in accordance with some embodiments.

FIG. 5A is a cross-sectional view of a chip structure 500, in accordance with some embodiments. FIG. 5B is a top view of a region A of the chip structure 500 of FIG. 5A, in accordance with some embodiments. The region A of FIG. 5A shows a cross-sectional view illustrating the chip structure 500 along a sectional line 5A-5A' in FIG. 5B, in accordance with some embodiments.

As shown in FIGS. 5A and 5B, the chip structure 500 is similar to the chip structure 100 of FIG. 1J, except that the entire conductive via structures 182*a*, 182*b*, and 182*c* of the chip structure 500 are under the opening 192 of the passivation layer 190, in accordance with some embodiments.

Figure 6A:
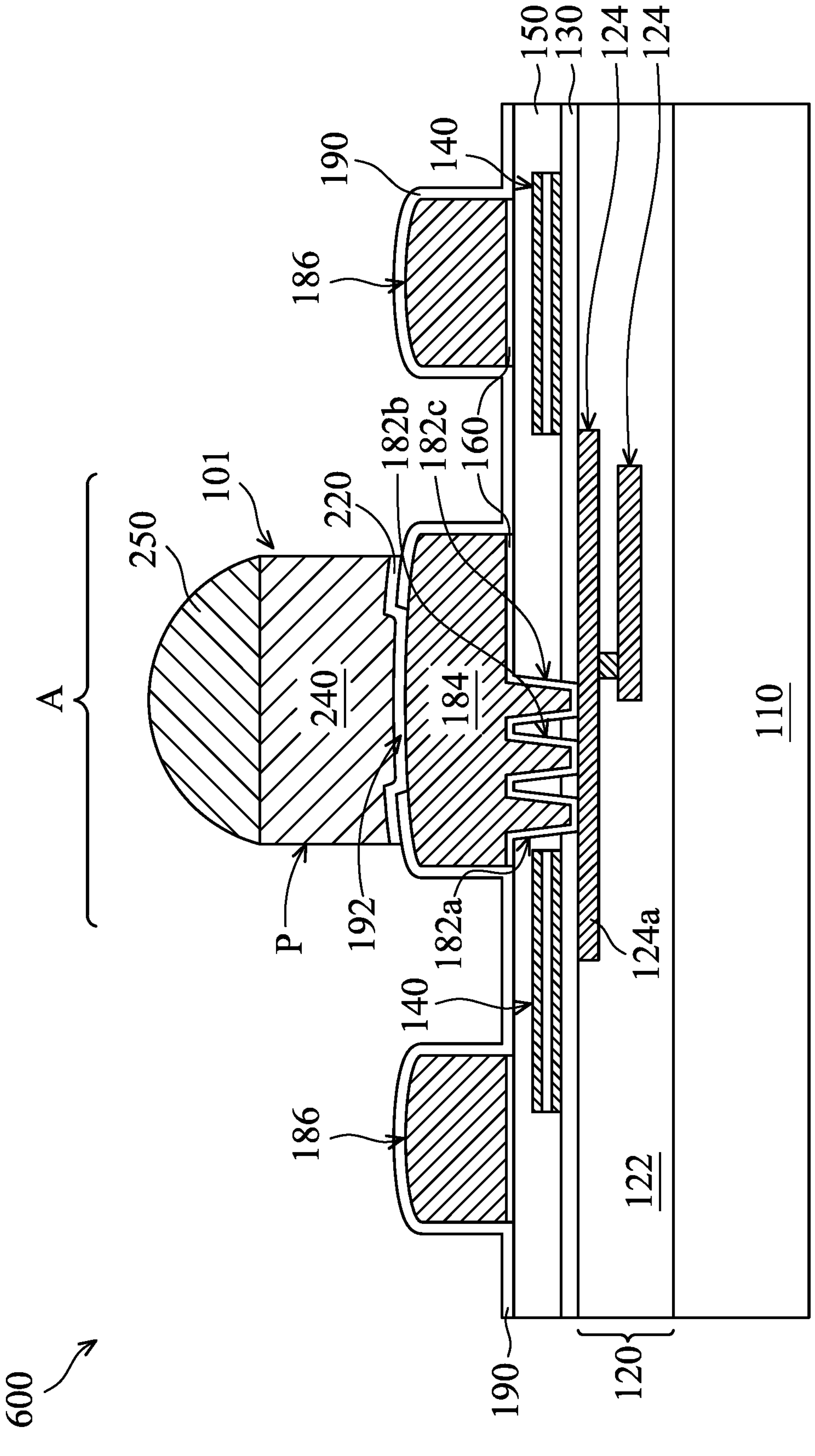
FIG. 6A is a cross-sectional view of a chip structure, in accordance with some embodiments.
Figure 6B:
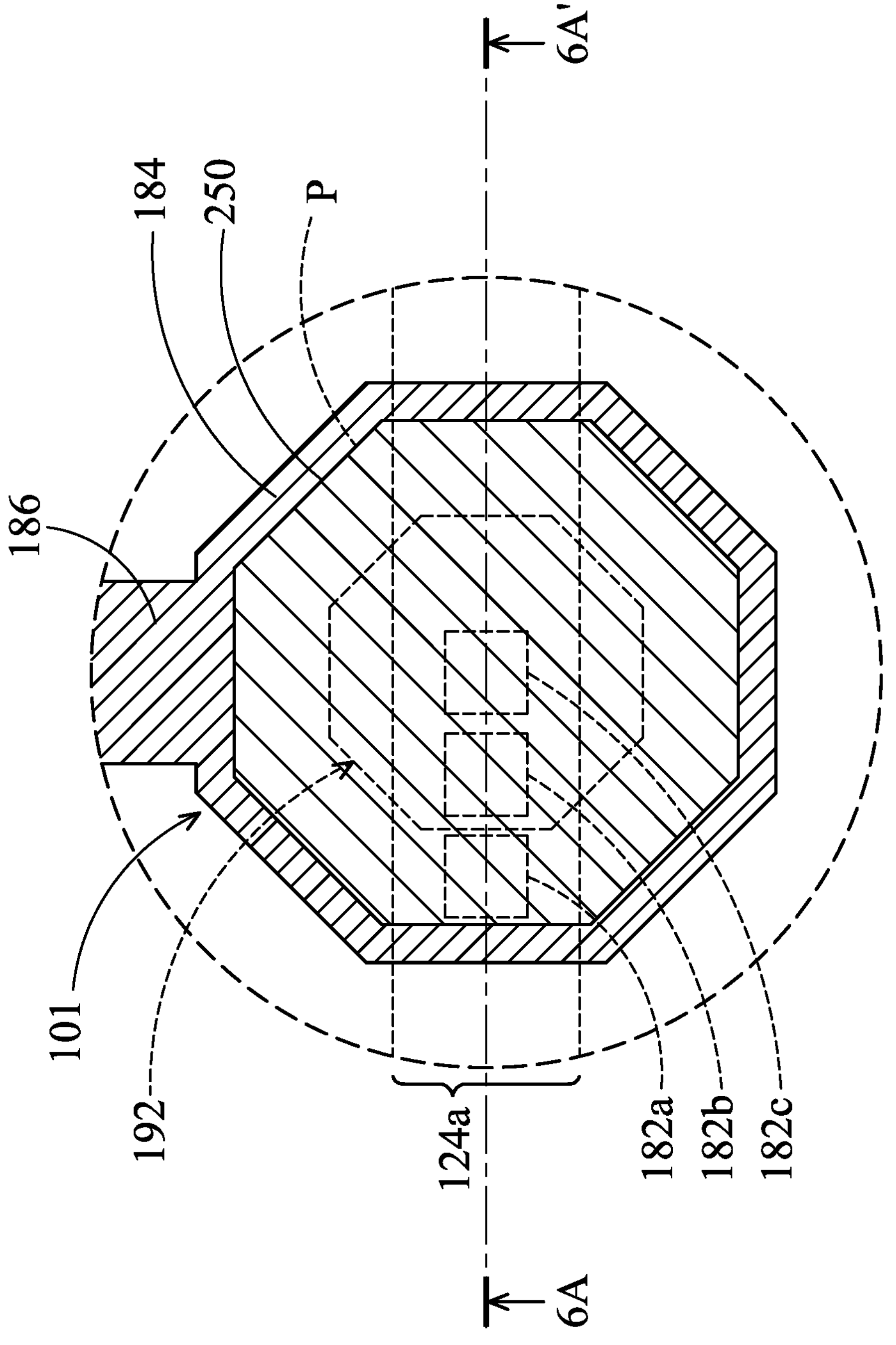
FIG. 6B is a top view of a region of the chip structure of FIG. 6A, in accordance with some embodiments.

FIG. 6A is a cross-sectional view of a chip structure 600, in accordance with some embodiments. FIG. 6B is a top view of a region A of the chip structure 600 of FIG. 6A, in accordance with some embodiments. The region A of FIG. 6A shows a cross-sectional view illustrating the chip structure 600 along a sectional line 6A-6A' in FIG. 6B, in accordance with some embodiments.

As shown in FIGS. 6A and 6B, the chip structure 600 is similar to the chip structure 100 of FIG. 1J, except that the entire conductive via structure 182*a* is under the passivation layer 190, and the entire conductive via structures 182*b* and 182*c* are under the opening 192 of the passivation layer 190, in accordance with some embodiments.

Figure 7A:
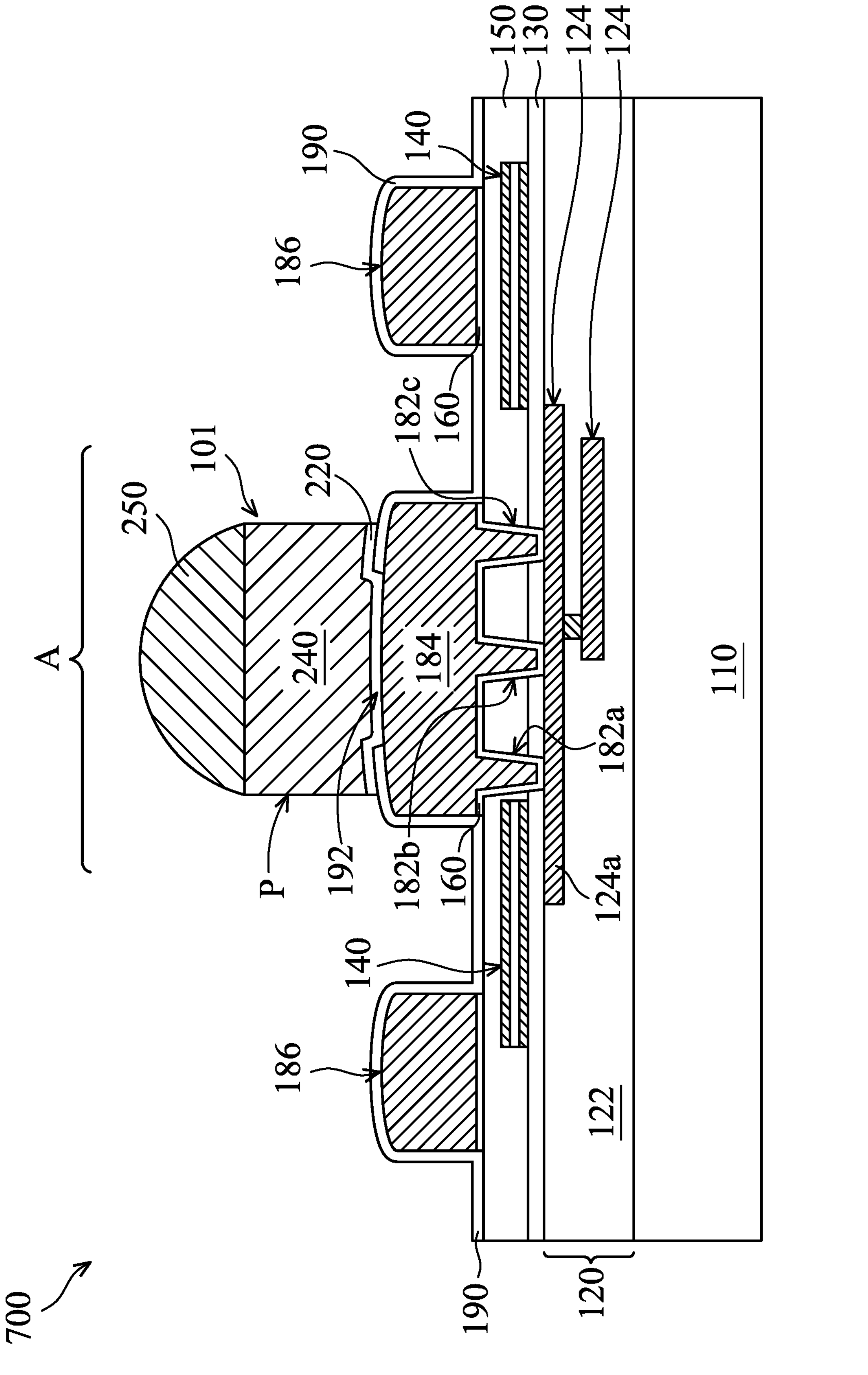
FIG. 7A is a cross-sectional view of a chip structure, in accordance with some embodiments.
Figure 7B:
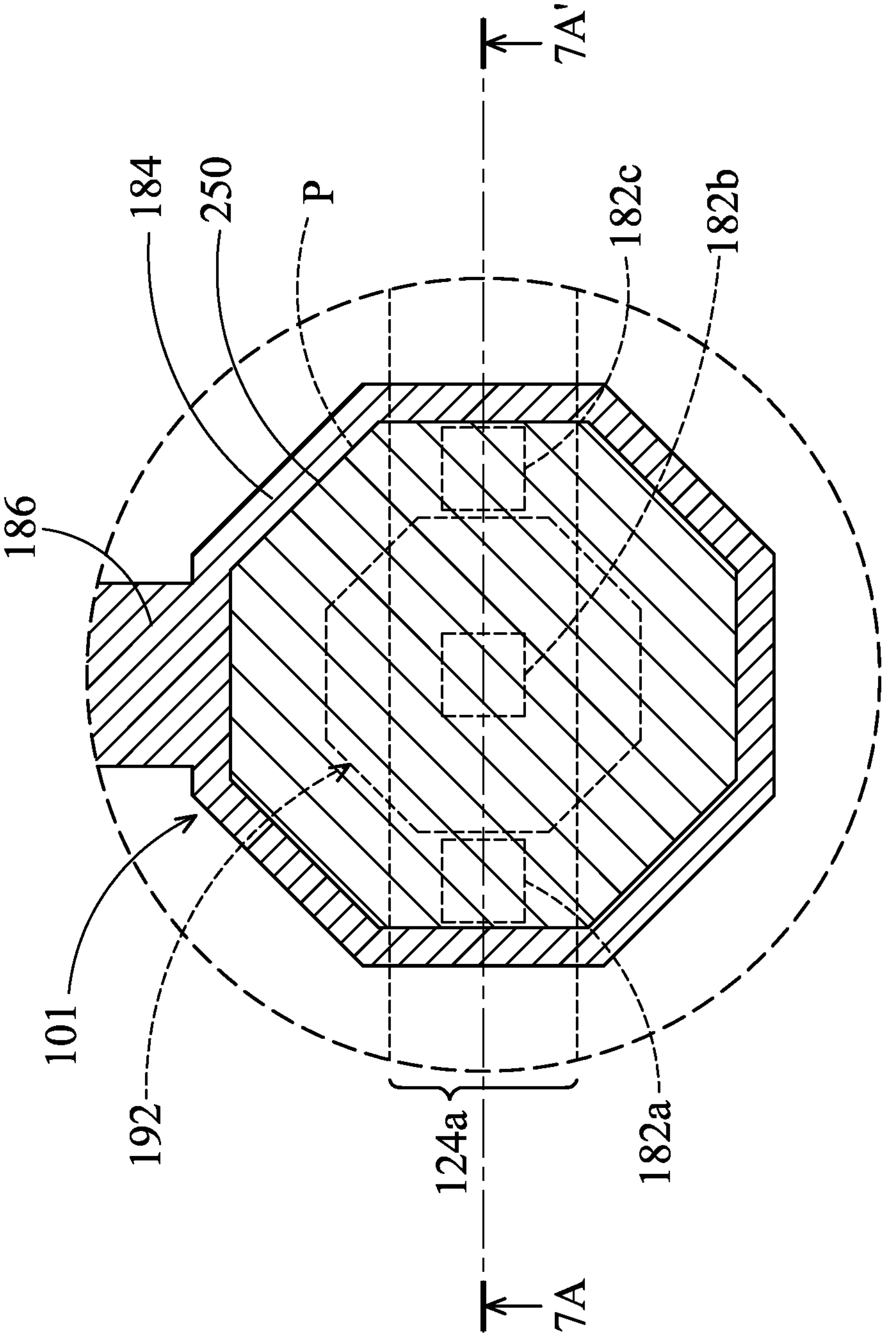
FIG. 7B is a top view of a region of the chip structure of FIG. 7A, in accordance with some embodiments.

FIG. 7A is a cross-sectional view of a chip structure 700, in accordance with some embodiments, FIG. 7B is a top view of a region A of the chip structure 700 of FIG. 7A, in accordance with some embodiments. The region A of FIG. 7A shows a cross-sectional view illustrating the chip structure 700 along a sectional line 7A-7A' in FIG. 7B, in accordance with some embodiments.

As shown in FIGS. 7A and 7B, the chip structure 700 is similar to the chip structure 100 of FIG. 1J, except that the conductive via structures 182*a* and 182*c* are entirely under the passivation layer 190, in accordance with some embodiments.

Figure 8A:
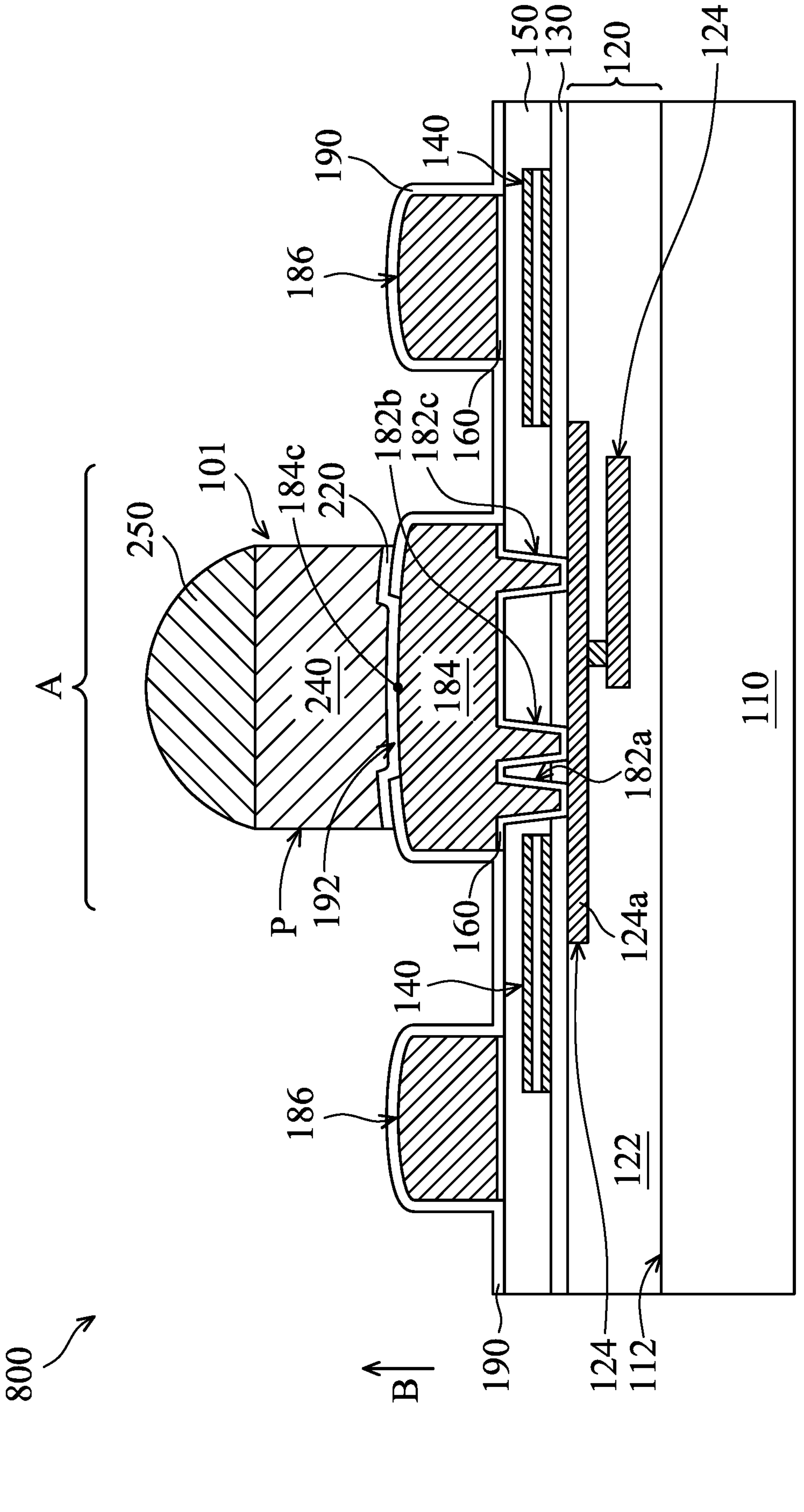
FIG. 8A is a cross-sectional view of a chip structure, in accordance with some embodiments.
Figure 8B:
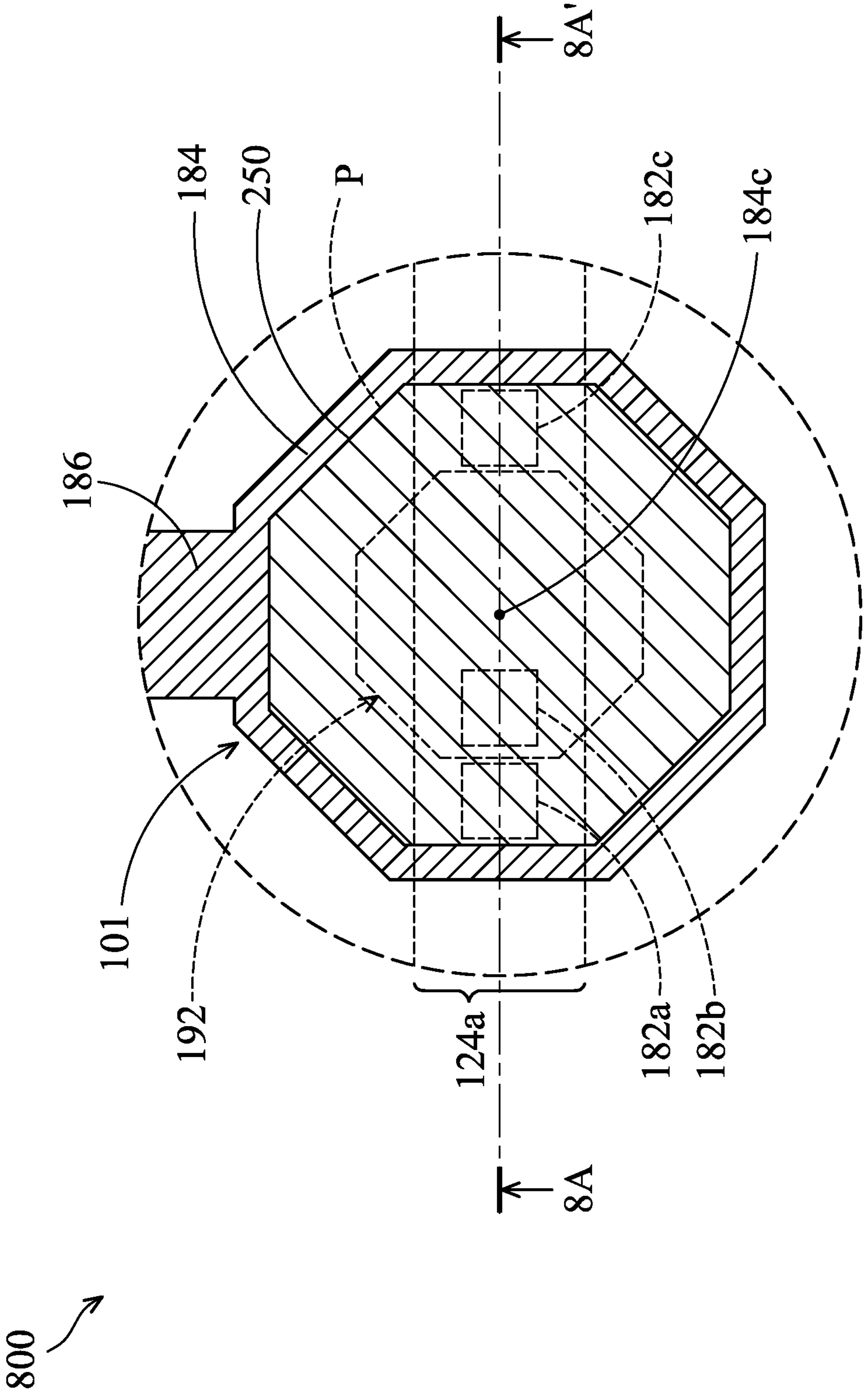
FIG. 8B is a top view of a region of the chip structure of FIG. 8A, in accordance with some embodiments.

FIG. 8A is a cross-sectional view of a chip structure 800, in accordance with some embodiments, FIG. 8B is a top view of a region A of the chip structure 800 of FIG. 8A, in accordance with some embodiments. The region A of FIG. 8A shows a cross-sectional view illustrating the chip structure 800 along a sectional line 8A-8A' in FIG. 8B, in accordance with some embodiments.

As shown in FIGS. 8A and 8B, the chip structure 800 is similar to the chip structure 700 of FIGS. 7A and 7B, except that the conductive via structure 182*b* and a center portion 184*c* of the conductive pad 184 are misaligned in a direction B perpendicular to the top surface 112 of the substrate 110, in accordance with some embodiments.

Figure 9:
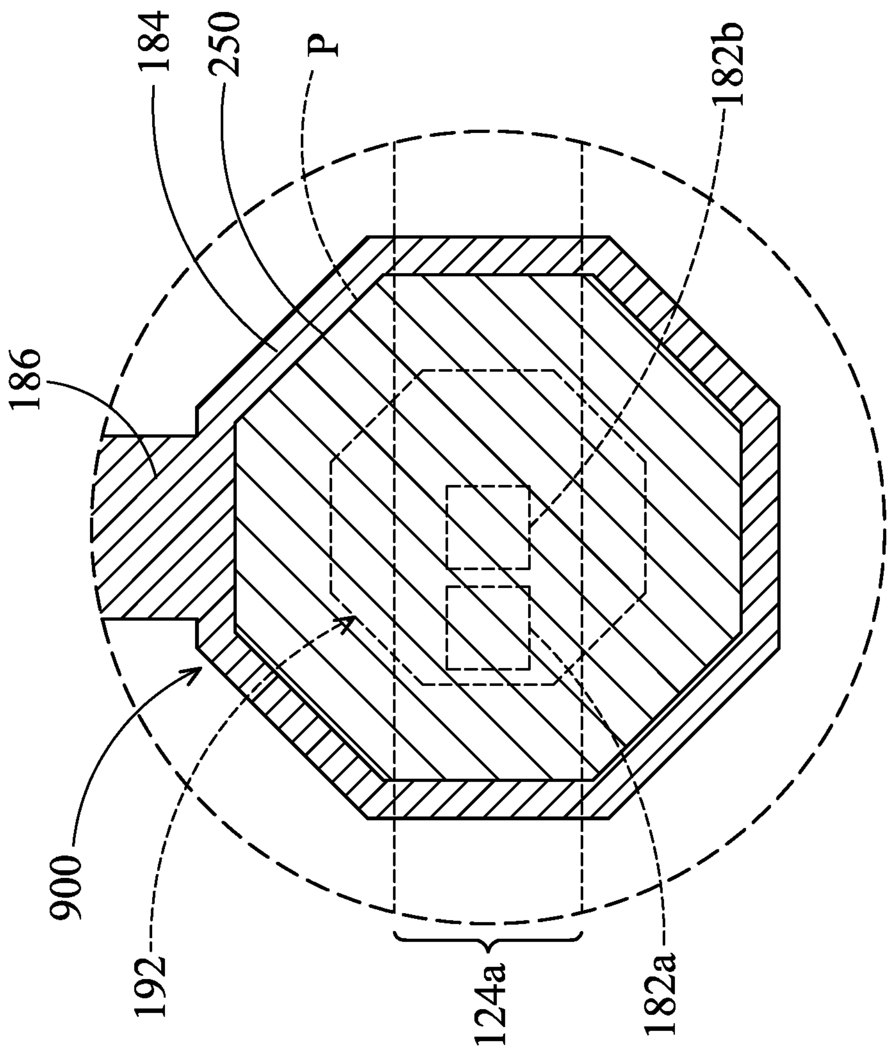
FIG. 9 is a top view of a conductive connector and a conductive line of a chip structure, in accordance with some embodiments.

FIG. 9 is a top view of a conductive connector 900 and a conductive line 124*a* of a chip structure, in accordance with some embodiments. As shown in FIG. 9, the conductive connector 900 is similar to the conductive connector 101 of FIGS. 5A and 5B, except that the conductive connector 900 does not have the conductive via structure 182*c* of the conductive connector 101 of FIGS. 5A and 5B, in accordance with some embodiments.

Figure 10:
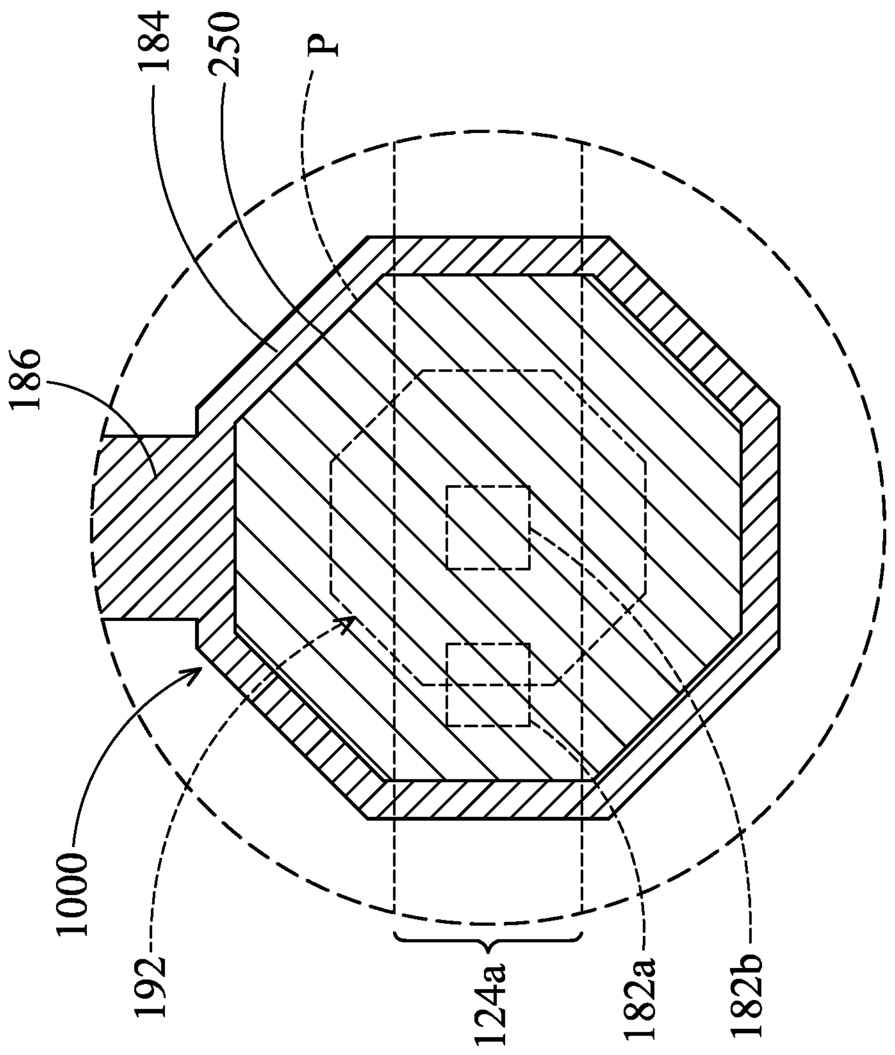
FIG. 10 is a top view of a conductive connector and a conductive line of a chip structure, in accordance with some embodiments.

FIG. 10 is a top view of a conductive connector 1000 and a conductive line 124*a* of a chip structure, in accordance with some embodiments. As shown in FIG. 10, the conductive connector 1000 is similar to the conductive connector 101 of FIGS. 1J and 1J-1, except that the conductive connector 1000 does not have the conductive via structure 182*c* of the conductive connector 101 of FIGS. 1J and 1J-1, in accordance with some embodiments.

Figure 11:
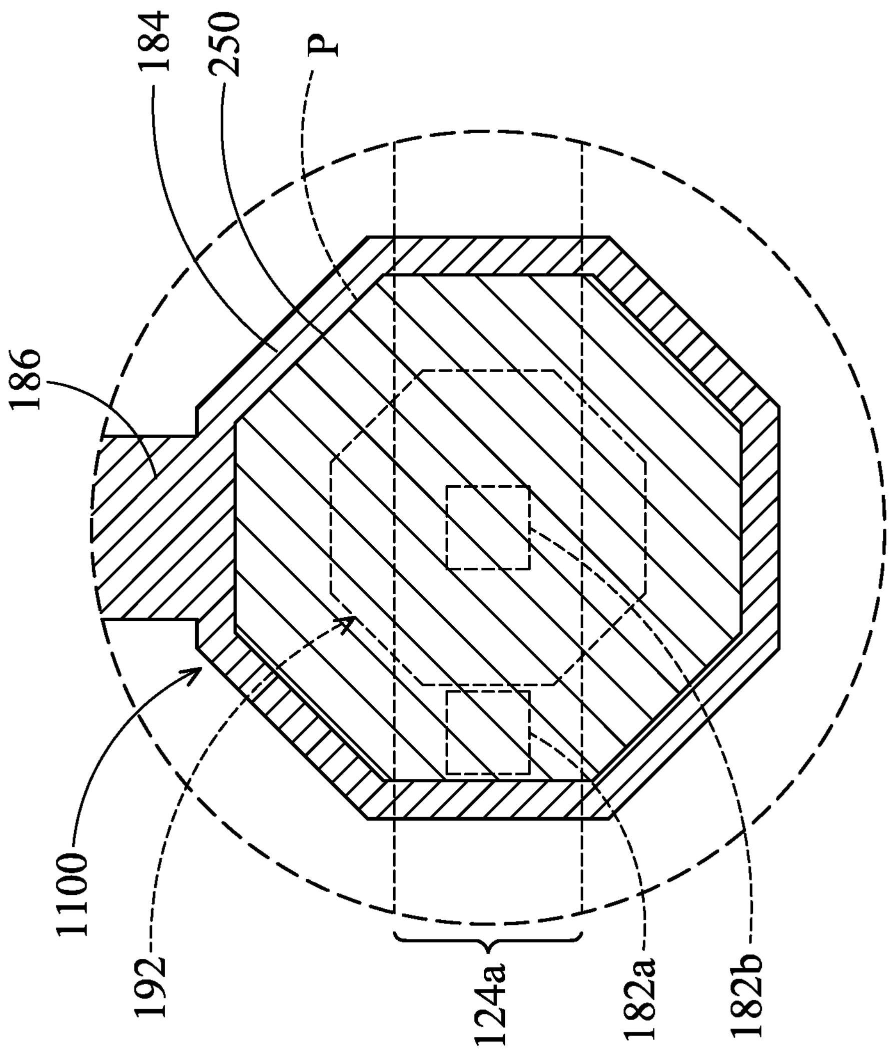
FIG. 11 is a top view of a conductive connector and a conductive line of a chip structure, in accordance with some embodiments.

FIG. 11 is a top view of a conductive connector 1100 and a conductive line 124*a* of a chip structure, in accordance with some embodiments. As shown in FIG. 11, the conductive connector 1100 is similar to the conductive connector 101 of FIGS. 7A and 7B, except that the conductive connector 1100 does not have the conductive via structure 182*c* of the conductive connector 101 of FIGS. 7A and 7B, in accordance with some embodiments.

Figure 12:
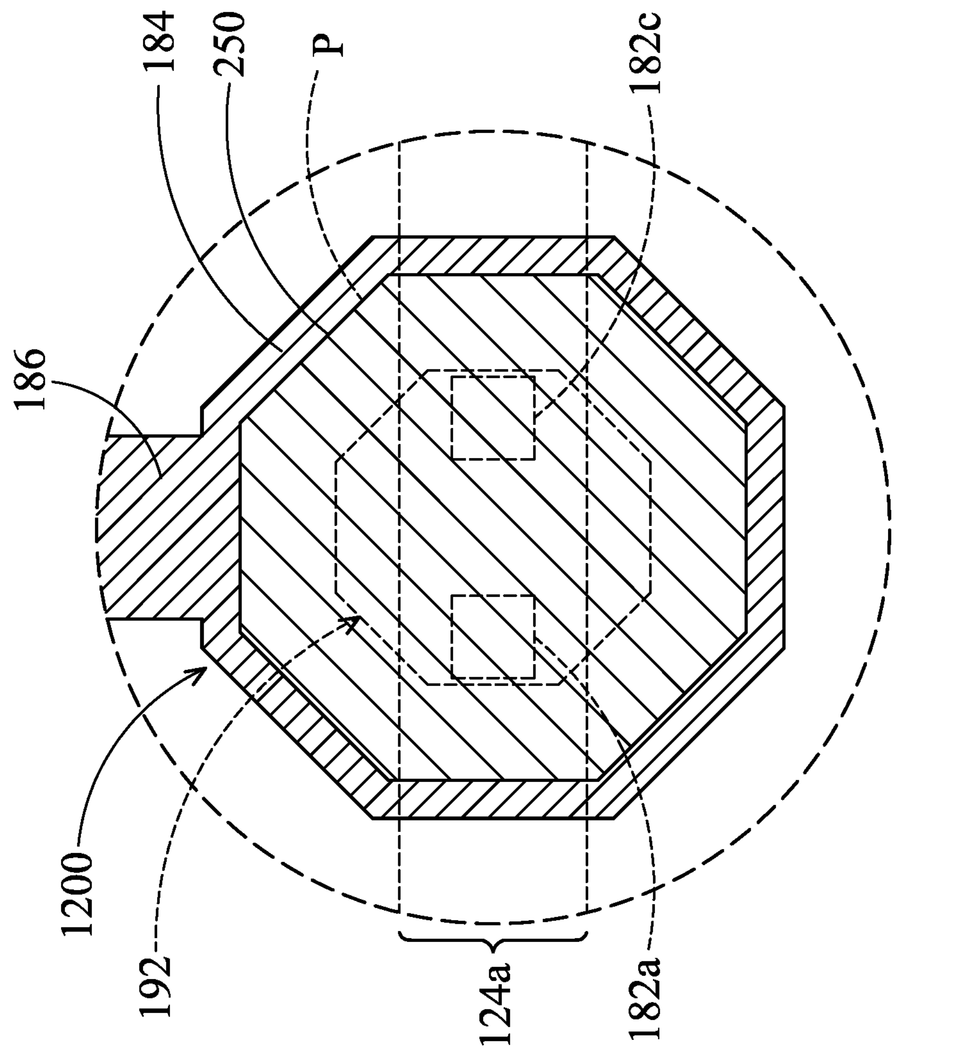
FIG. 12 is a top view of a conductive connector and a conductive line of a chip structure, in accordance with some embodiments.

FIG. 12 is a top view of a conductive connector 1200 and a conductive line 124*a* of a chip structure, in accordance with some embodiments. As shown in FIG. 12, the conductive connector 1200 is similar to the conductive connector 101 of FIGS. 5A and 5B, except that the conductive connector 1200 does not have the conductive via structure 182*b* of the conductive connector 101 of FIGS. 5A and 5B, in accordance with some embodiments.

Figure 13:
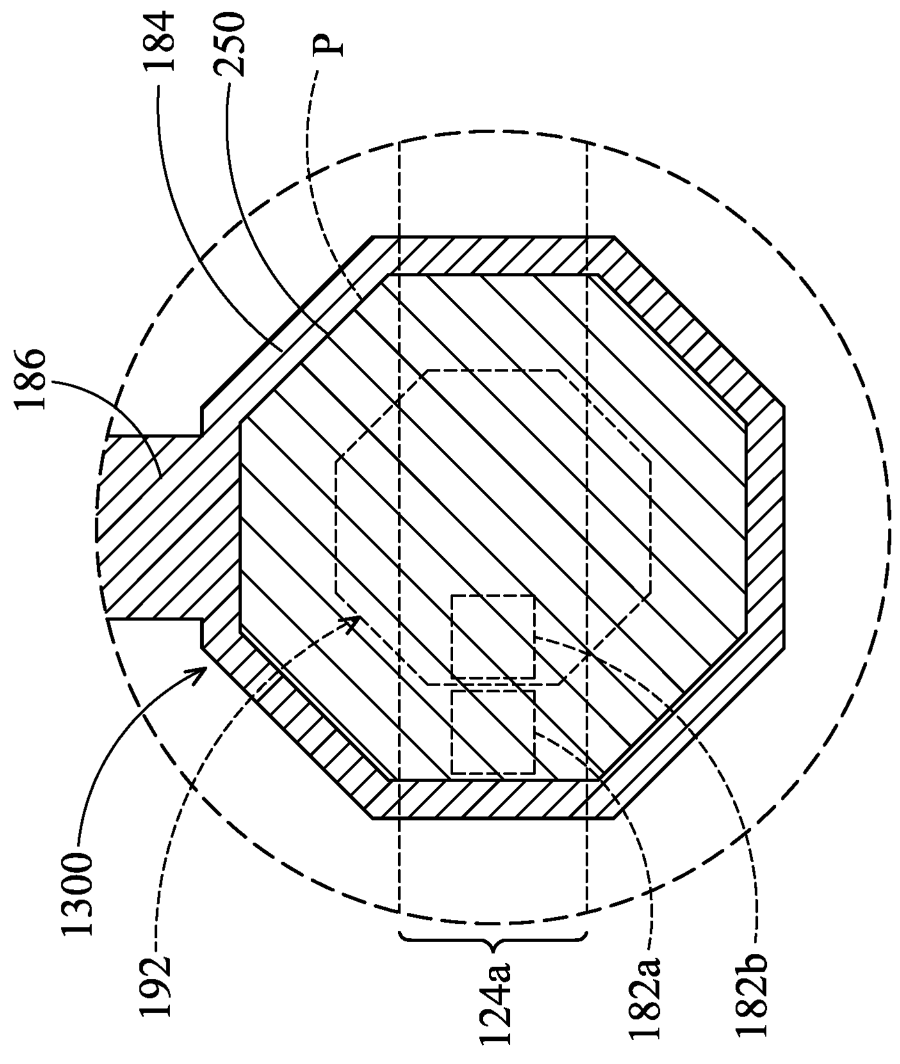
FIG. 13 is a top view of a conductive connector and a conductive line of a chip structure, in accordance with some embodiments.

FIG. 13 is a top view of a conductive connector 1300 and a conductive line 124*a* of a chip structure, in accordance with some embodiments. As shown in FIG. 13, the conductive connector 1300 is similar to the conductive connector 101 of FIGS. 8A and 8B, except that the conductive connector 1300 does not have the conductive via structure 182*c* of the conductive connector 101 of FIGS. 8A and 8B, in accordance with some embodiments.

Figure 14:
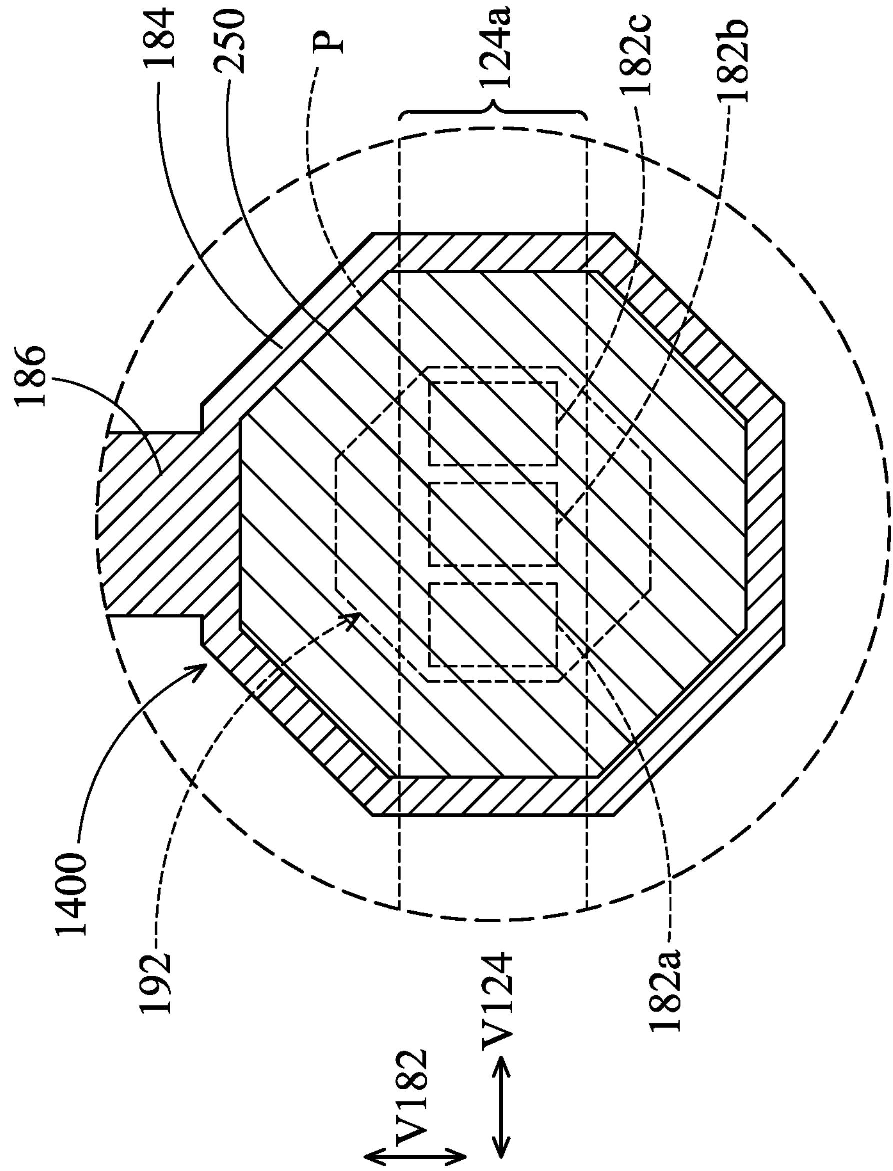
FIG. 14 is a top view of a conductive connector and a conductive line of a chip structure, in accordance with some embodiments.

FIG. 14 is a top view of a conductive connector 1400 and a conductive line 124*a* of a chip structure, in accordance with some embodiments. As shown in FIG. 14, the conductive connector 1400 is similar to the conductive connector 101 of FIGS. 5A and 5B, except that the conductive via structures 182*a*, 182*b*, and 182*c* of the conductive connector 1400 have a rectangle shape, in accordance with some embodiments. The longitudinal axis V182 of the conductive via structures 182*a*, 182*b*, and 182*c* is substantially perpendicular to the longitudinal axis V124 of the conductive line 124*a*, in accordance with some embodiments.

Figure 15:
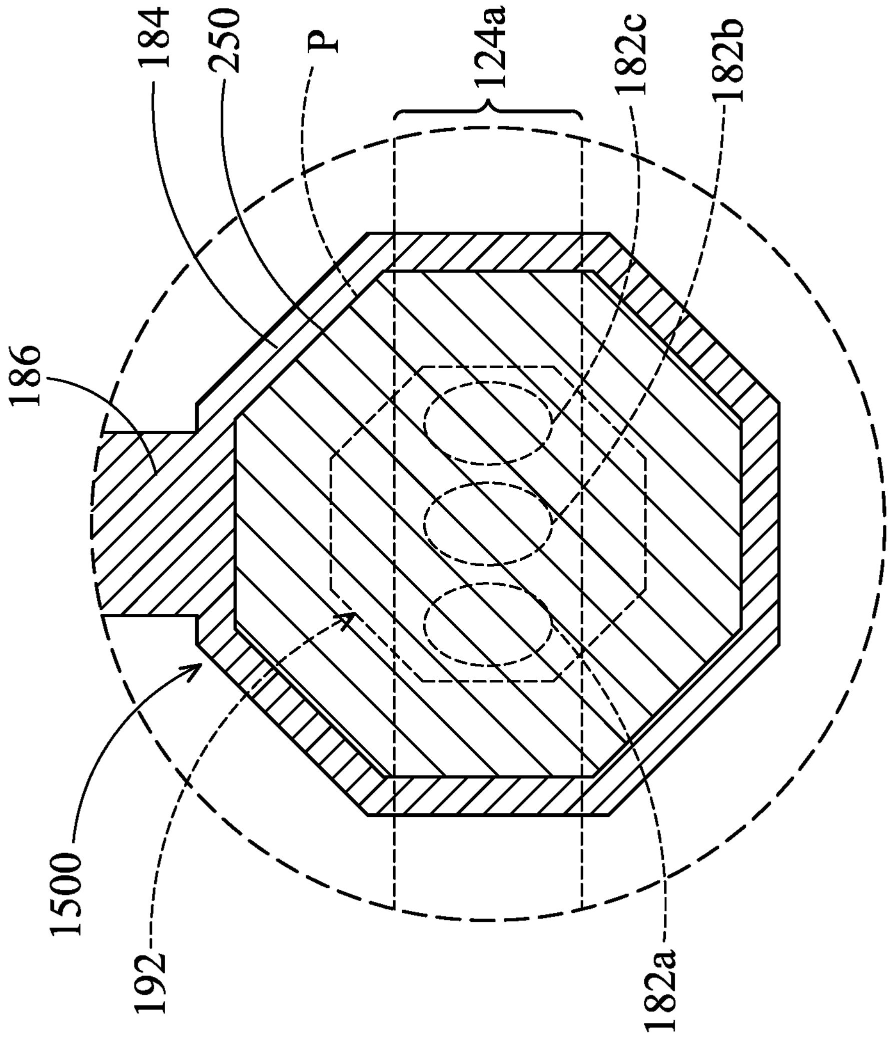
FIG. 15 is a top view of a conductive connector and a conductive line of a chip structure, in accordance with some embodiments.

FIG. 15 is a top view of a conductive connector 1500 and a conductive line 124*a* of a chip structure, in accordance with some embodiments. As shown in FIG. 15, the conductive connector 1500 is similar to the conductive connector 1400 of FIG. 14, except that the conductive via structures 182*a*, 182*b*, and 182*c* of the conductive connector 1500 have an oval shape, in accordance with some embodiments.

Figure 16:
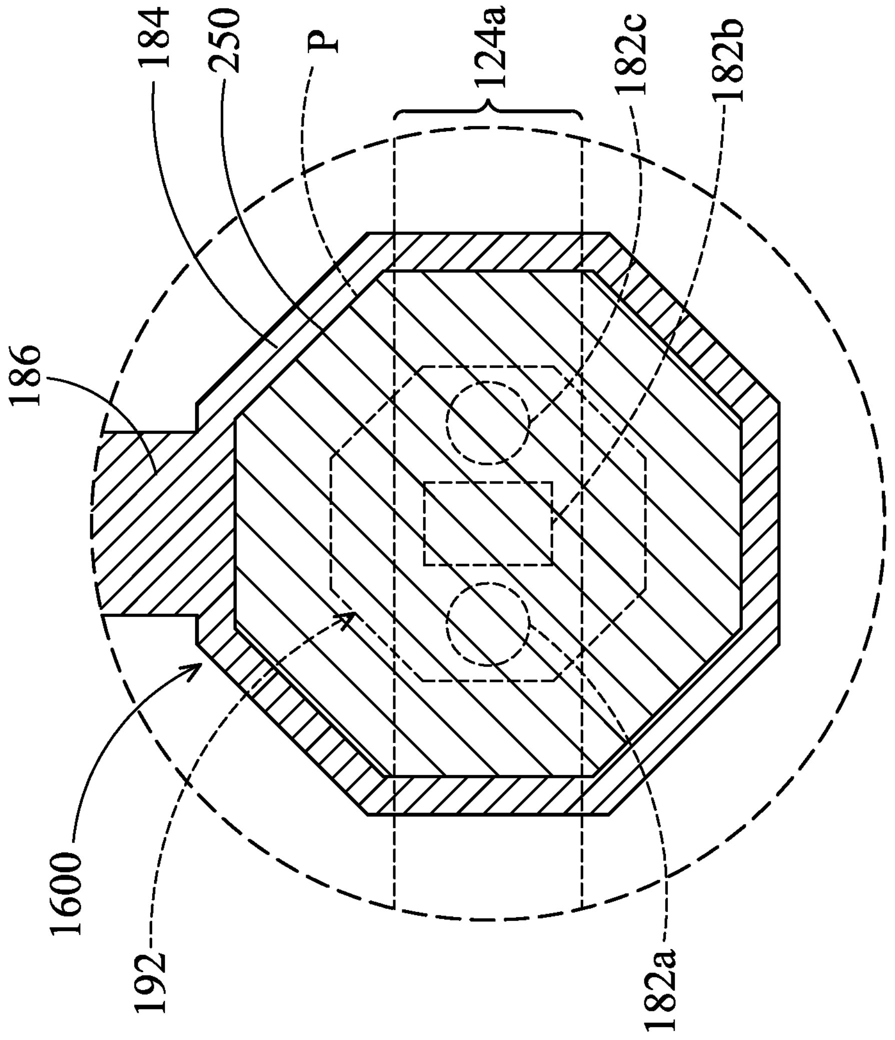
FIG. 16 is a top view of a conductive connector and a conductive line of a chip structure, in accordance with some embodiments.

FIG. 16 is a top view of a conductive connector 1600 and a conductive line 124*a* of a chip structure, in accordance with some embodiments. As shown in 16, the conductive connector 1600 is similar to the conductive connector 1400 of FIG. 14, except that the conductive via structures 182*a* and 182*c* of the conductive connector 1600 have a round shape, in accordance with some embodiments. The conductive via structure 182*b* has a rectangle shape, which is different from that of the conductive via structures 182*a* and 182*c*, in accordance with some embodiments.

Figure 17:
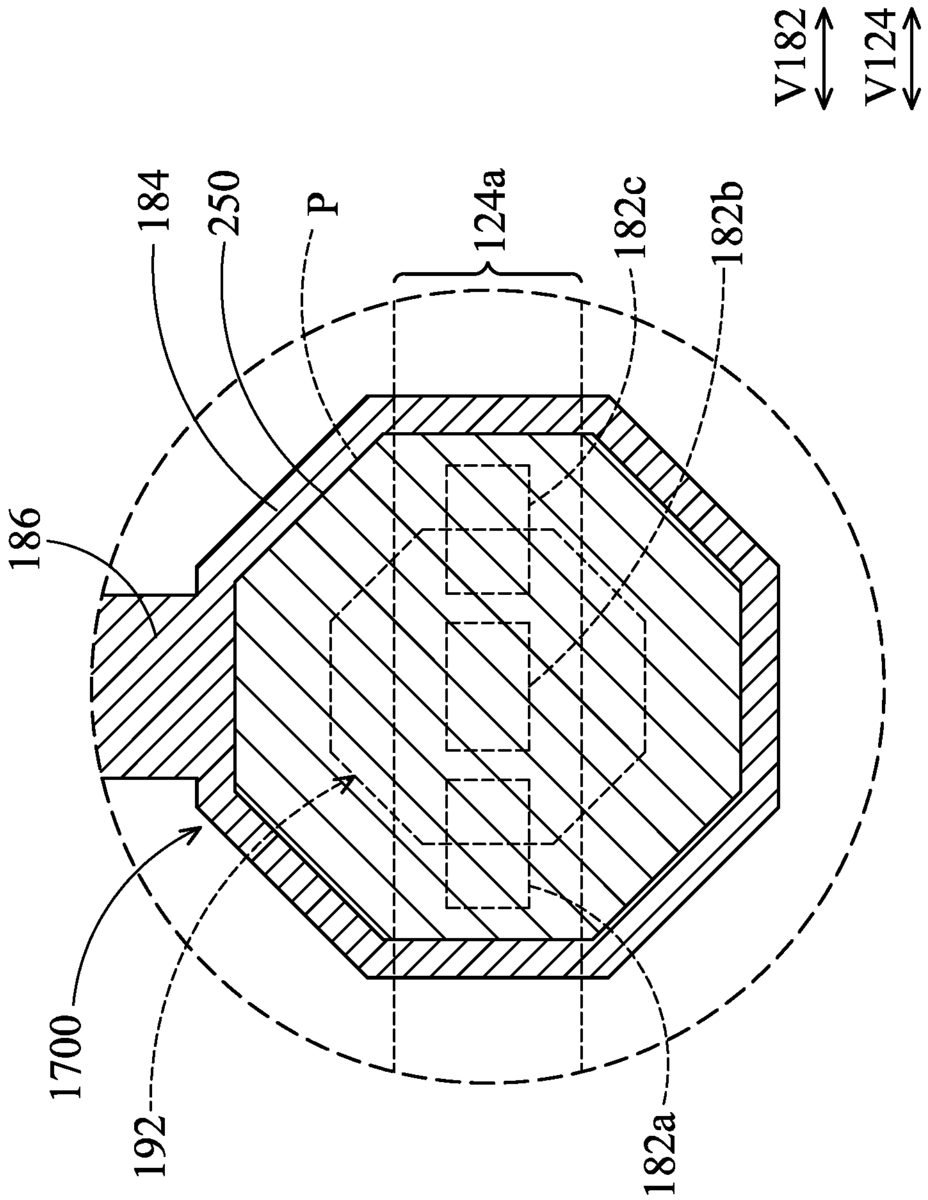
FIG. 17 is a top view of a conductive connector and a conductive line of a chip structure, in accordance with some embodiments.

FIG. 17 is a top view of a conductive connector 1700 and a conductive line 124*a* of a chip structure, in accordance with some embodiments. As shown in FIG. 17, the conductive connector 1700 is similar to the conductive connector 1400 of FIG. 14, except that the longitudinal axis V182 of the conductive via structures 182*a*, 182*b*, and 182*c* of the conductive connector 1700 is substantially parallel to the longitudinal axis V124 of the conductive line 124*a*, in accordance with some embodiments.

Figure 18:
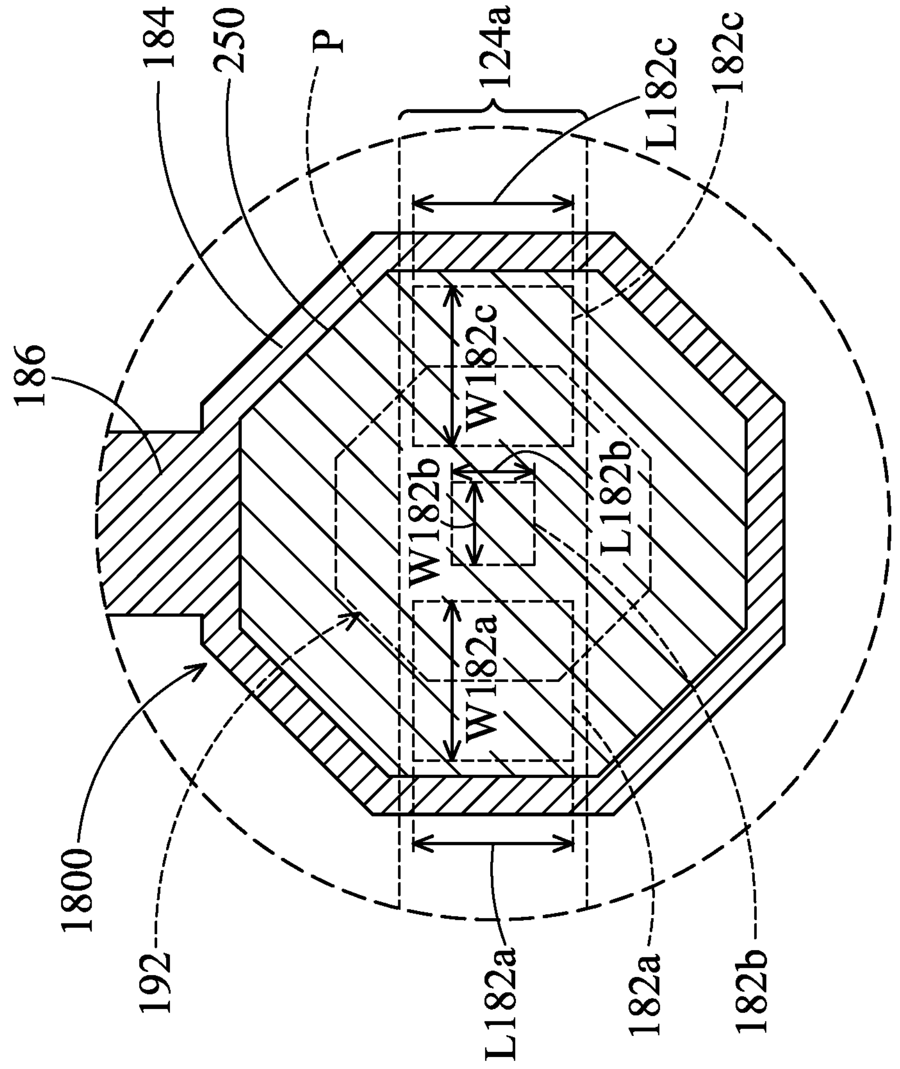
FIG. 18 is a top view of a conductive connector and a conductive line of a chip structure, in accordance with some embodiments.

FIG. 18 is a top view of a conductive connector 1800 and a conductive line 124*a* of a chip structure, in accordance with some embodiments. As shown in FIG. 18, the conductive connector 1800 is similar to the conductive connector 101 of FIGS. 1J and 1J-1, except that the conductive via structures 182*a* and 182*c* are both larger than the conductive via structure 182*b*, in accordance with some embodiments.

That is, the width W182*a* of the conductive via structure 182*a* and the width W182*c* of the conductive via structure 182*c* are both greater than the width W182*b* of the conductive via structure 182*b*, in accordance with some embodiments. The length L182*a* of the conductive via structure 182*a* and the length L182*c* of the conductive via structure 182*c* are both greater than the length L182*b* of the conductive via structure 182*b*, in accordance with some embodiments.

Figure 19:
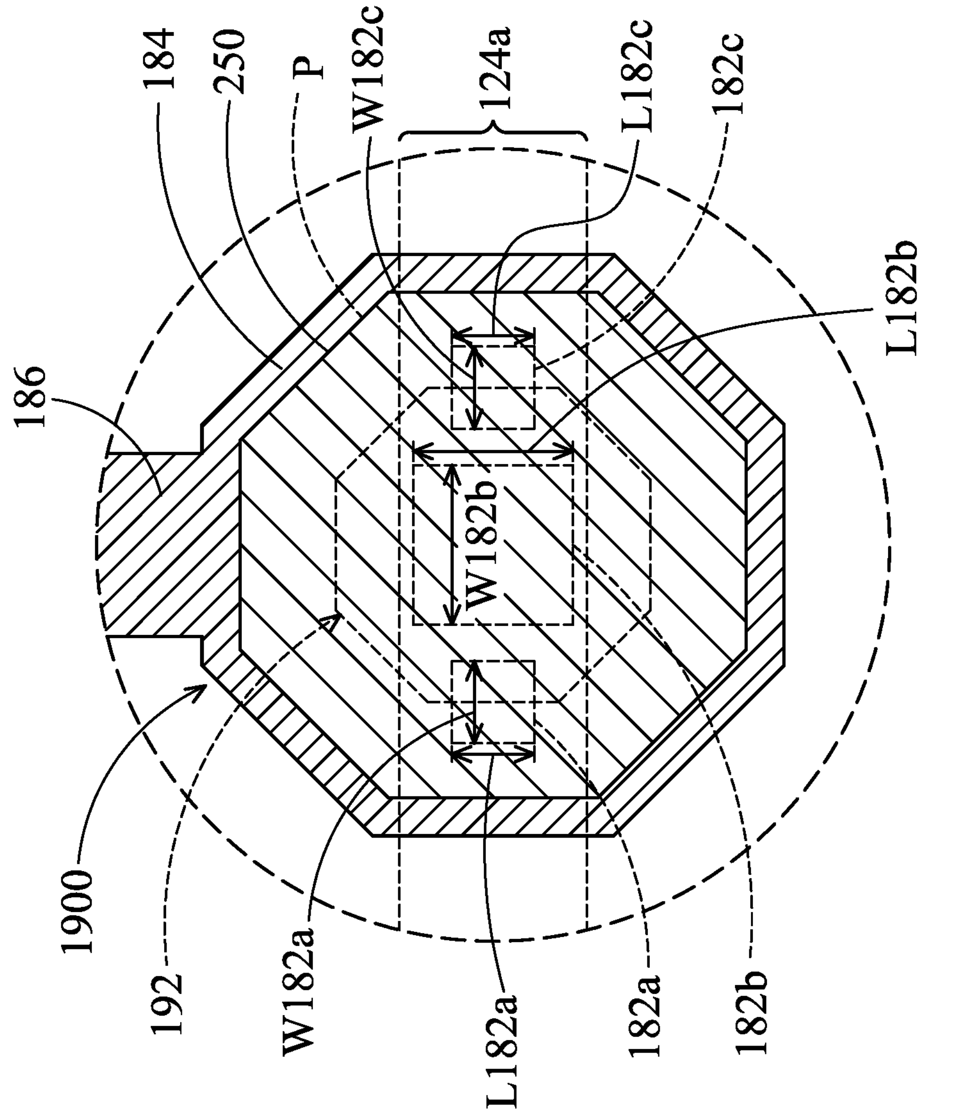
FIG. 19 is a top view of a conductive connector and a conductive line of a chip structure, in accordance with some embodiments.

FIG. 19 is a top view of a conductive connector 1900 and a conductive line 124*a* of a chip structure, in accordance with some embodiments. As shown in FIG. 19, the conductive connector 1900 is similar to the conductive connector 101 of FIGS. 1J and 1J-1, except that the conductive via structures 182*a* and 182*c* are both smaller an the conductive via structure 182*b*, in accordance with some embodiments.

That is, the width W182*a* of the conductive via structure 182*a* and the width W182*c* of the conductive via structure 182*c* are both less than the width W182*b* of the conductive via structure 182*b*, in accordance with some embodiments. The length L182*a* of the conductive via structure 182*a* and the length L182*c* of the conductive via structure 182*c* are both less than the length L182*b* of the conductive via structure 182*b*, in accordance with some embodiments.

Figure 20:
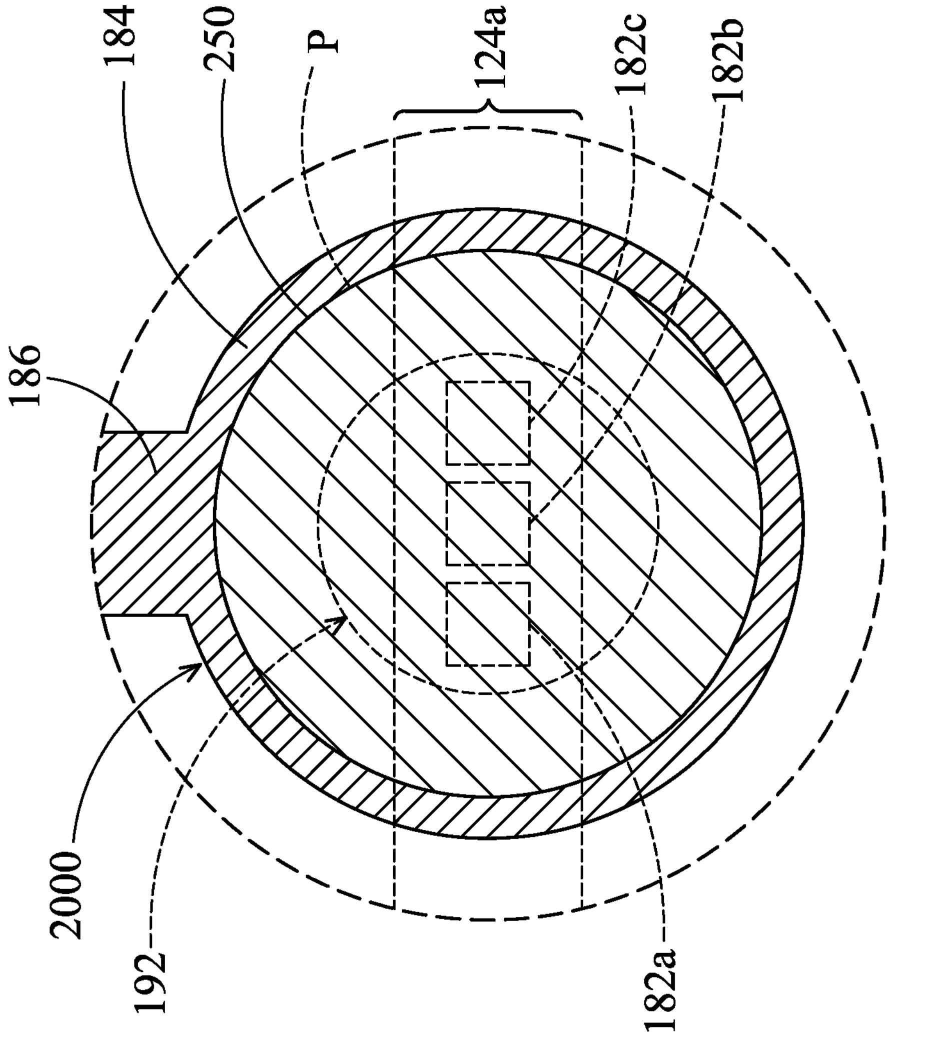
FIG. 20 is a top view of a conductive connector and a conductive line of a chip structure, in accordance with some embodiments.

FIG. 20 is a top view of a conductive connector 2000 and a conductive line 124*a* of a chip structure, in accordance with some embodiments. As shown in FIG. 20, the conductive connector 2000 is similar to the conductive connector 101 of FIGS. 5A and 5B, except that the conductive pad 184, the conductive pillar P, the solder bump 250, and the opening 192 have a round shape, in accordance with some embodiments.

Figure 21:
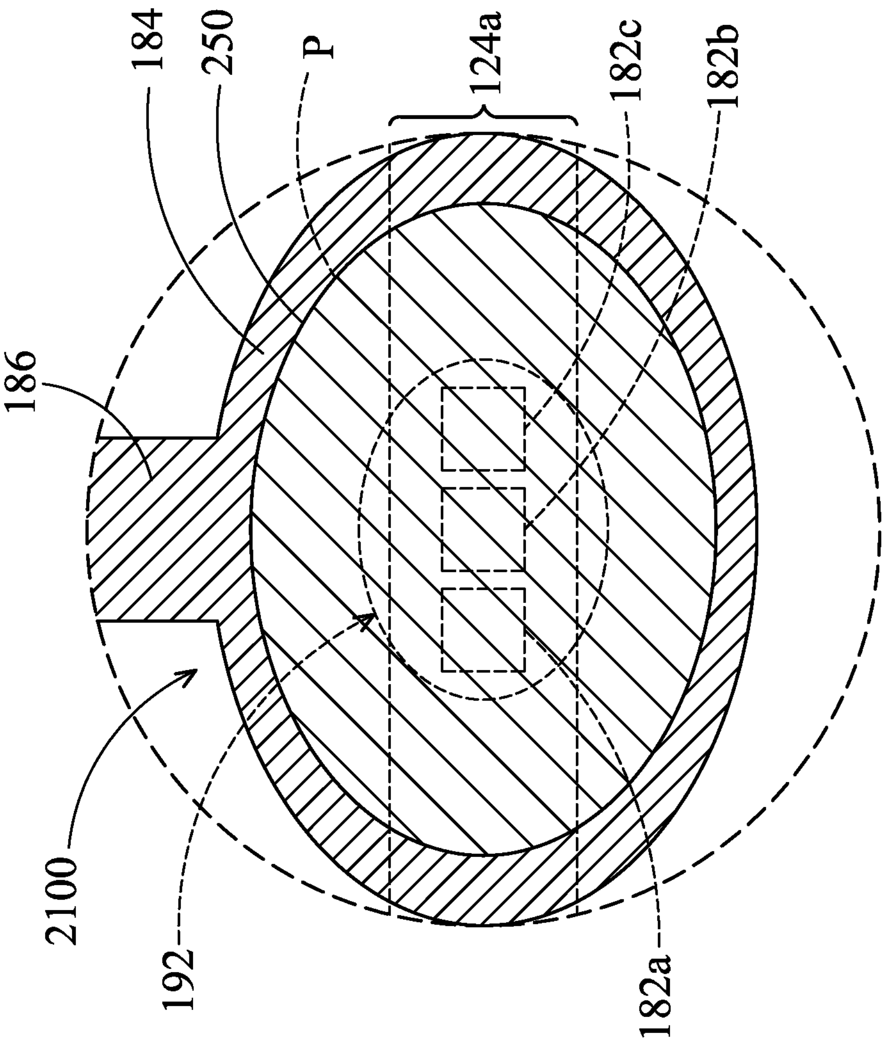
FIG. 21 is a top view of a conductive connector and a conductive line of a chip structure, in accordance with some embodiments.

FIG. 21 is a top view of a conductive connector 2100 and a conductive line 124*a* of a chip structure, in accordance with some embodiments. As shown in FIG. 21, the conductive connector 2100 is similar to the conductive connector 101 of FIGS. 5A and 5B, except that the conductive pad 184, the conductive pillar P, the solder bump 250, and the opening 192 have an oval shape, in accordance with some embodiments.

Figure 22:
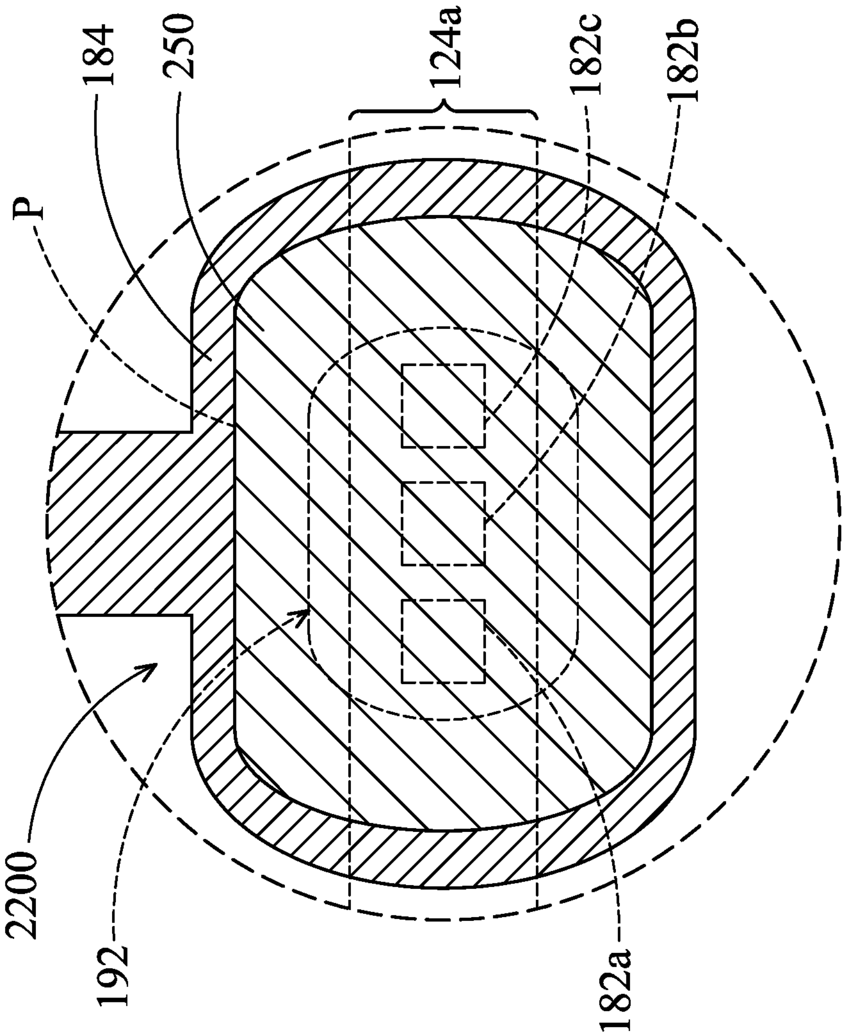
FIG. 22 is a top view of a conductive connector and a conductive line of a chip structure, in accordance with some embodiments.

FIG. 22 is a top view of a conductive connector 2200 and a conductive line 124*a* of a chip structure, in accordance with some embodiments. As shown in F the conductive connector 2200 is similar to the conductive connector 101 of FIGS. 5A and 5B, except that the conductive pad 184, the conductive pillar P, the solder bump 250, and the opening 192 have an oval-like shape, in accordance with some embodiments.

Figure 23A:
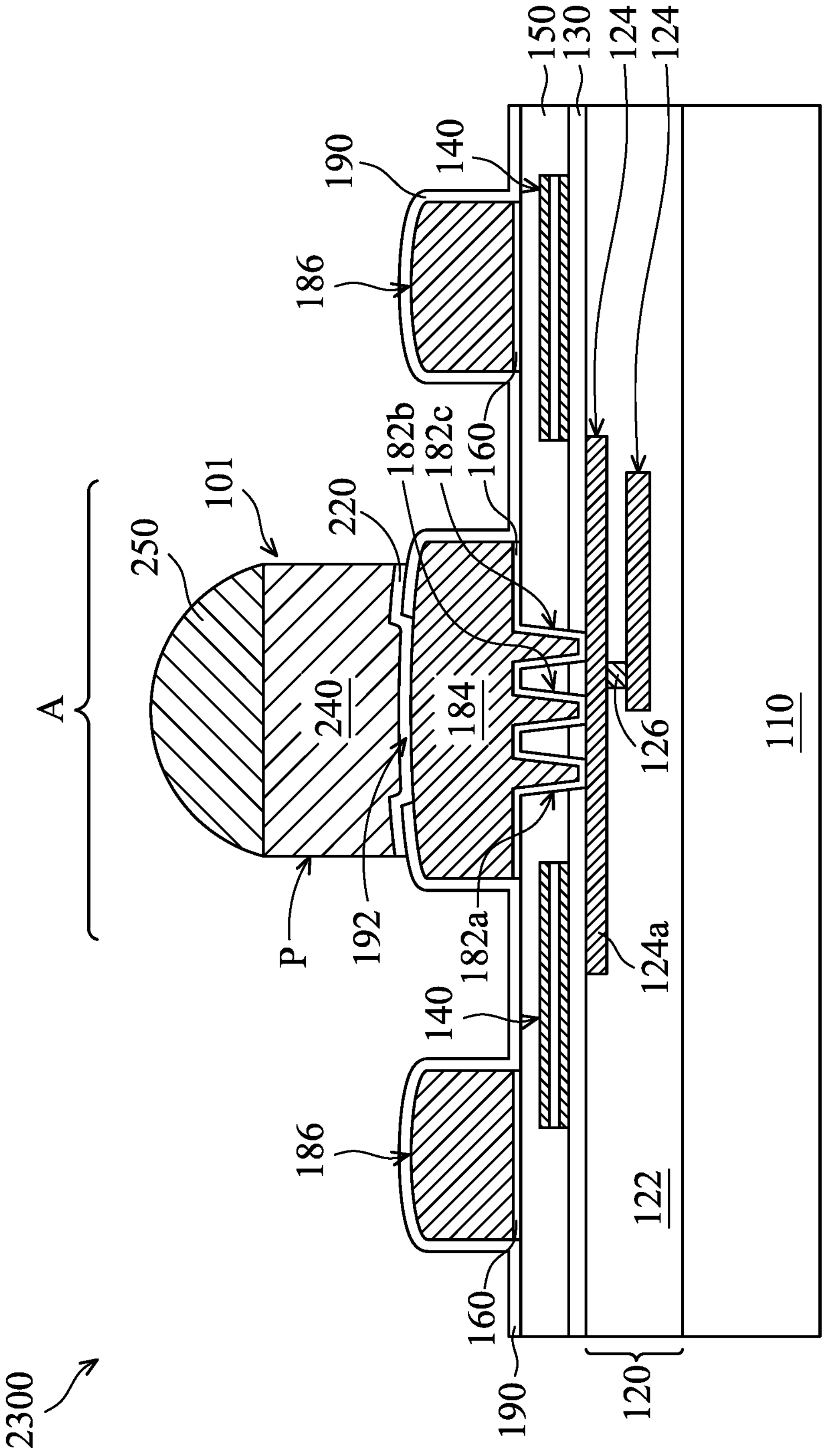
FIG. 23A is a cross-sectional view of a first portion of a chip structure, in accordance with some embodiments.
Figure 23B:
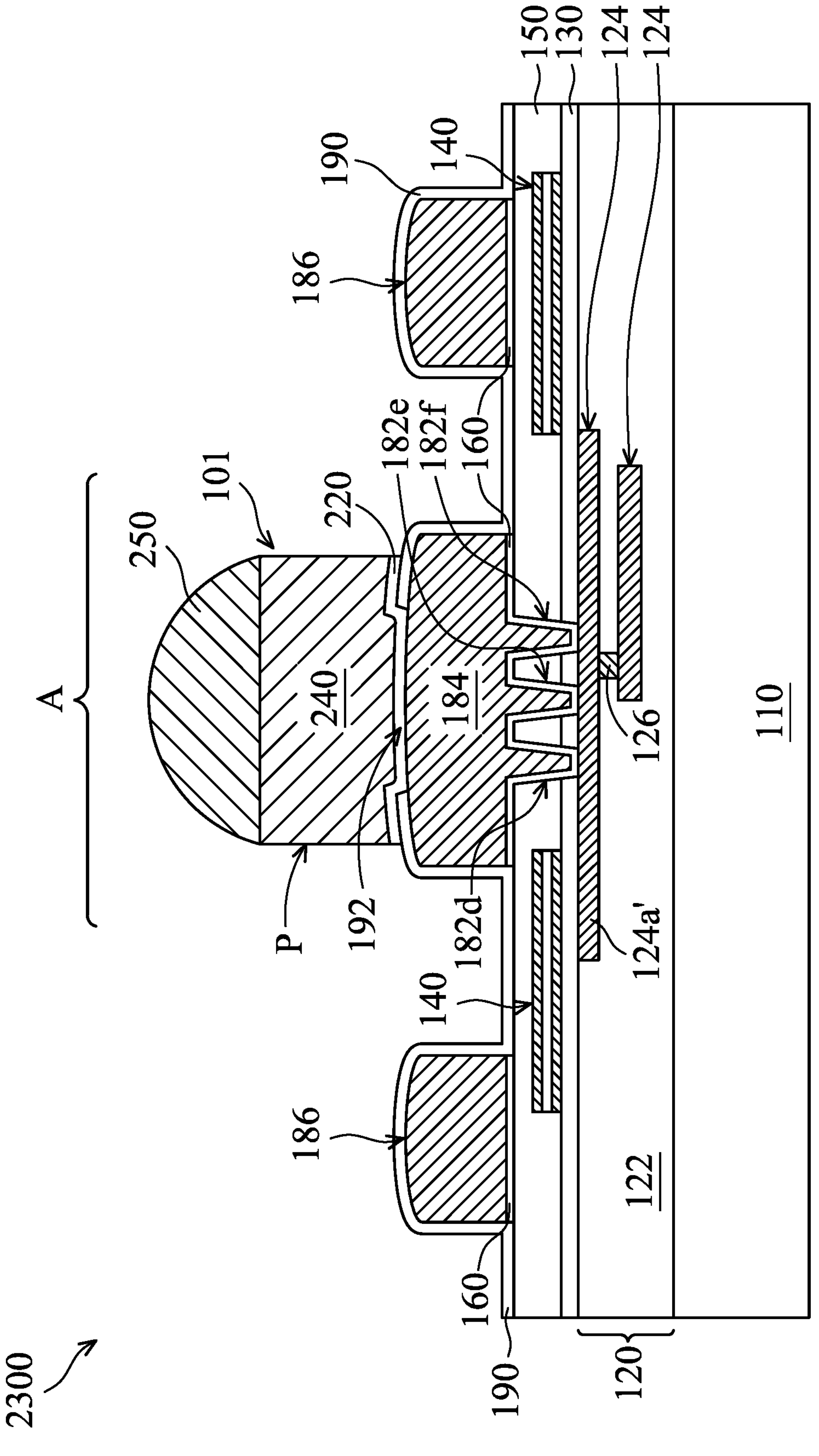
FIG. 23B is a cross-sectional view of a second portion of the chip structure of FIG. 23A, in accordance with some embodiments.
Figure 23C:
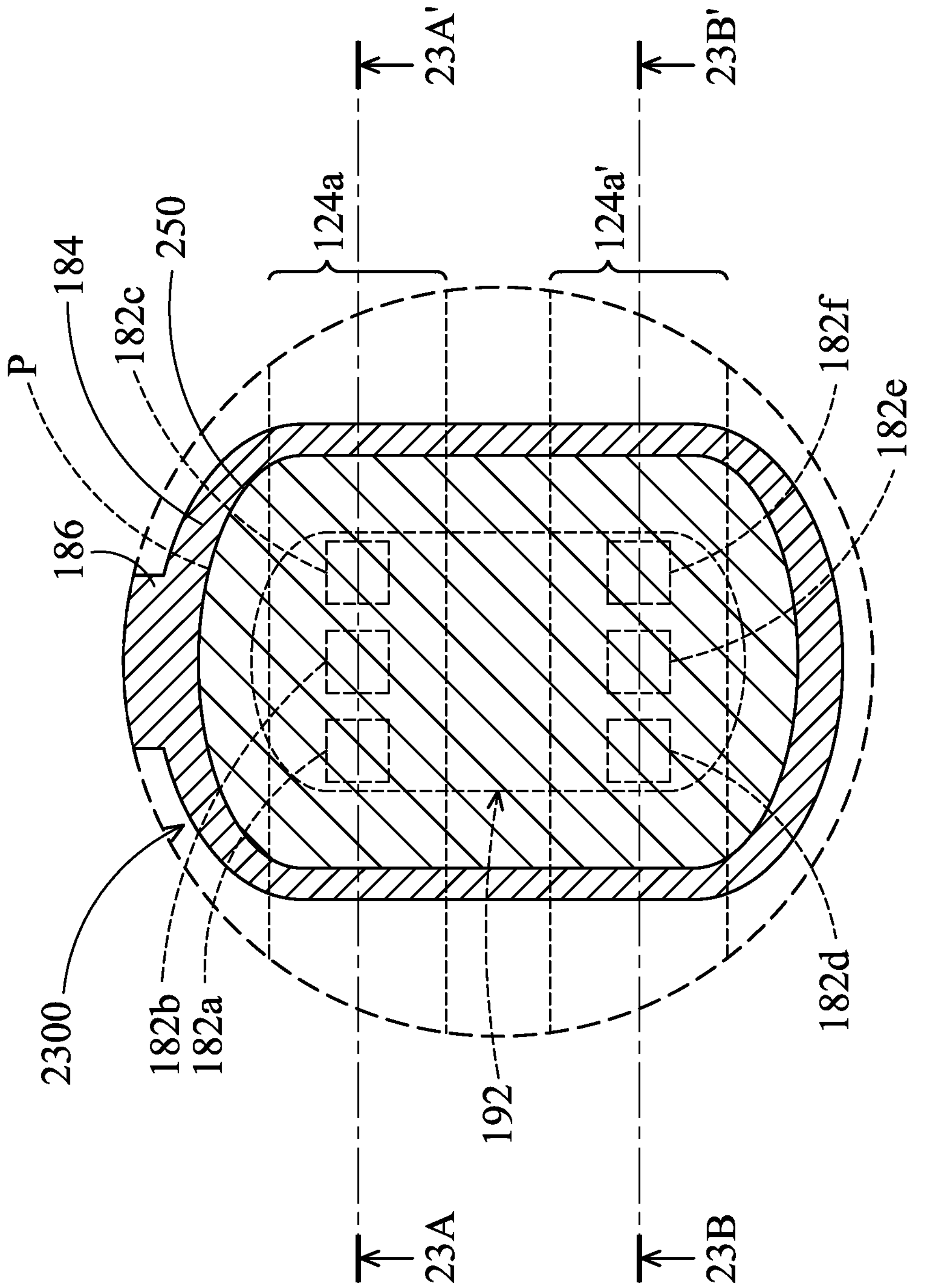
FIG. 23C is a top view of a region of the chip structure of FIGS. 23A and 23B, in accordance with some embodiments.

FIG. 23A is a cross-sectional view of a first portion of a chip structure 2300, in accordance with some embodiments. FIG. 23B is a cross-sectional view of a second portion of the chip structure 2300 of FIG. 23A, in accordance with some embodiments. FIG. 23C is a top view of a region A of the chip structure 2300 of FIGS. 23A and 23B, in accordance with some embodiments. The region A of FIG. 23A shows a cross-sectional view illustrating the chip structure 2300 along a sectional line 23A-23A' in FIG. 23C, in accordance with some embodiments. The region A of FIG. 23B shows a cross-sectional view illustrating the chip structure 2300 along a sectional line 23B-23B' in FIG. 23C, in accordance with some embodiments.

As shown in FIGS. 23A, 23B and 23C, the chip structure 2300 is similar to the chip structure 500 of FIGS. 5A and 5B, except that the chip structure 2300 further includes conductive via structures 182*d*, 182*e*, and 182*f* connected between the conductive pad 184 and a conductive line 124*a*' of the topmost wiring layer 124, in accordance with some embodiments. The conductive pad 184 overlaps the conductive lines 124*a* and 124*a*', in accordance with some embodiments. The conductive pad 184 are connected to the conductive lines 124*a* and 124*a*' through the conductive via structures 182*a*, 182*b*, 182*c*, 182*d*, 182*e*, and 182*f*, in accordance with some embodiments. The conductive via structures 182*d*, 182*e*, and 182*f* pass through the passivation layers 130 and 150, in accordance with some embodiments.

Figure 24:
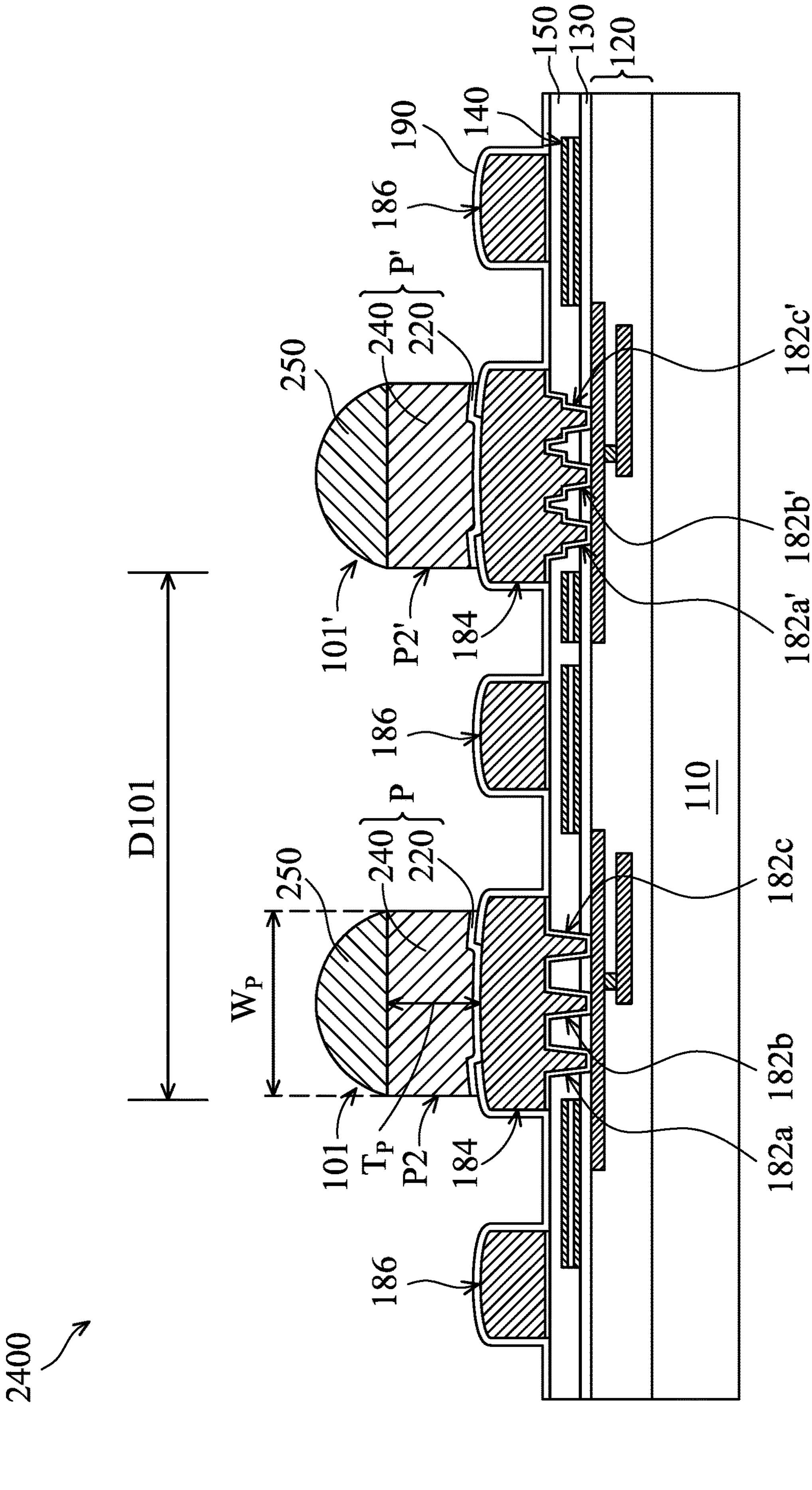
FIG. 24 is a cross-sectional view of a chip structure, in accordance with some embodiments.

FIG. 24 is a cross-sectional view of a chip structure 2400, in accordance with some embodiments. As shown in FIG. 24, the chip structure 2400 is similar to the chip structure 100 of FIG. 1J, except that the chip structure 2400 further includes a conductive connector 101', in accordance with some embodiments.

The conductive connector 101' is similar to the conductive connector 101, except that the conductive via structures 182*a*', 182*b*', and 182*c*' of the conductive connector 101' have a ladder-like shape, which is different from that of the conductive via structures 182*a*, 182*b*, and 182*c* of the conductive connector 101, in accordance with some embodiments.

The conductive pillar P of the conductive connector 101 has a sidewall P2 facing away from the conductive connector 101', in accordance with some embodiments. The conductive pillar P' of the conductive connector 101' has a sidewall P2' facing the conductive connector 101, in accordance with some embodiments. In some embodiments, a distance D101 between the sidewalls P2 and P2' ranges from about 10 μm to about 50 μm. The conductive pillar P has a thickness $T_P$ ranging from about 5 μm to about 17 μm, in accordance with some embodiments. The conductive pillar P has a width $W_P$ ranging from about 5 μm to about 22 μm, in accordance with some embodiments.

Figure 25:
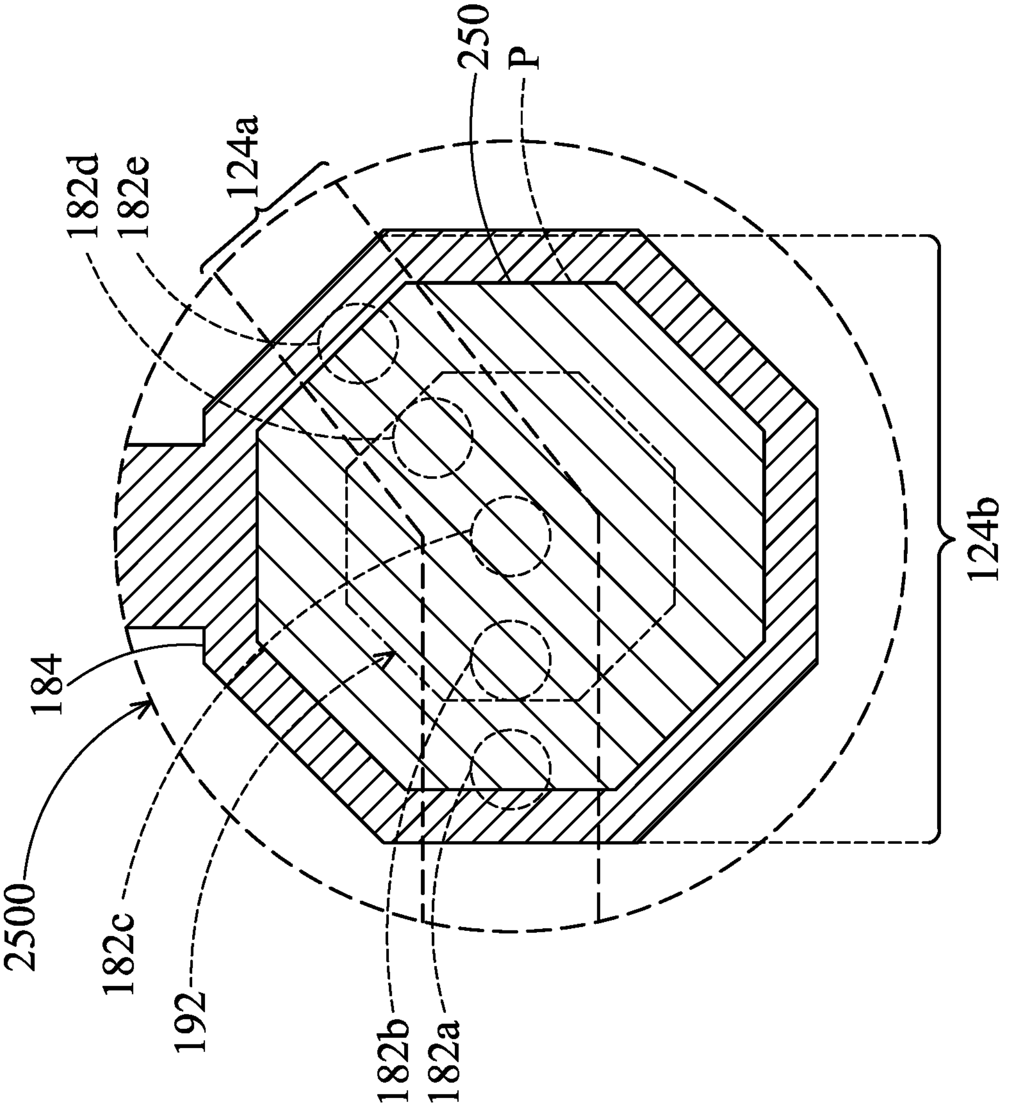
FIG. 25 is a top view of a conductive connector and a conductive line of a chip structure, in accordance with some embodiments.

FIG. 25 is a top view of a conductive connector 2500 and a conductive line 124*a* of a chip structure, in accordance with some embodiments. As shown in FIG. 25, the conductive connector 2500 is similar to the conductive connector 101 of FIG. 1J, except that the conductive pad 184 of the conductive connector 2500 overlaps a bending portion 124*b* of the conductive line 124*a*, in accordance with some embodiments.

The conductive connector 2500 further includes conductive via structures 182*d* and 182*e* connected between the conductive pad 184 and the conductive line 124*a*, in accordance with some embodiments. The conductive via structures 182*a*, 182*b*, 182*c*, 182*d* and 182*e* are arranged along the bending portion 124*b*, in accordance with some embodiments.

Processes and materials for forming the chip structures 200, 300, 400, 500, 600, 700, 800 and 2400 may be similar to, or the same as, those for forming the chip structure 100 described above. Processes and materials for forming the conductive connectors 900, 1000, 1100, 1200, 1300, 1400, 1500, 1600, 1700, 1800, 1900, 2000, 2100, 2200, and 2500 may be similar to, or the same as, those for forming the conductive connector 101 described above.

The chip structures 100, 200, 300, 400, 500, 600, 700, 800 and 2400 and the conductive connectors 900, 1000, 1100, 1200, 1300, 1400, 1500, 1600, 1700, 1800, 1900, 2000, 2100, 2200, and 2500 may be designed according to different requirements.

In accordance with some embodiments, chip structures and methods for forming the same are provided. The methods (for forming the chip structure) form multiple conductive via structures connected between a conductive pad and a conductive line. The conductive via structures are able to share the bonding stress from the conductive pad during a subsequent bonding process. Therefore, the conductive via structures are able to prevent the bonding stress from concentrating in only one conductive via structure, which improves the reliability of the chip structure. The conductive via structures may provide more support force than only one conductive via structure, and therefore the conductive via structures may reduce the bonding stress applied to passivation layers under the conductive pad, which prevents the passivation layers from cracking and/or delamination.

In accordance with some embodiments, a chip structure is provided. The chip structure includes a substrate. The chip structure includes a conductive line over the substrate. The chip structure includes a first passivation layer over the substrate and the conductive line. The chip structure includes a conductive pad over the first passivation layer covering the conductive line. The conductive pad is thicker and wider than the conductive line. The chip structure includes a first conductive via structure and a second conductive via structure passing through the first passivation layer and directly connected between the conductive pad and the conductive line. The chip structure includes a conductive pillar over the conductive pad.

In accordance with some embodiments, a chip structure is provided. The chip structure includes a substrate. The chip structure includes a first conductive line over the substrate. The chip structure includes a first passivation layer over the substrate and the first conductive line. The chip structure includes a conductive pad over the first passivation layer. The conductive pad overlaps a first portion of the first conductive line. The chip structure includes a first conductive via structure and a second conductive via structure passing through the first passivation layer and connected between the conductive pad and the first conductive line. The conductive pad is thicker than the first conductive via structure. The first conductive via structure and the second conductive via structure are arranged along the first portion of the first conductive line under the conductive pad. The chip structure includes a conductive pillar on the conductive pad.

In accordance with some embodiments, a chip structure is provided. The chip structure includes a substrate. The chip structure includes a first conductive line over the substrate. The chip structure includes a first conductive via structure and a second conductive via structure over and connected to the first conductive line. The chip structure includes a conductive pad over and connected to the first conductive via structure and the second conductive via structure. The conductive pad is thicker than the first conductive line. The chip structure includes a conductive pillar over the conductive pad.

The foregoing outlines features of several embodiments so that those skilled the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
a substrate;
a conductive line over the substrate;
a first passivation layer over the substrate and the conductive line;
a conductive pad over the first passivation layer covering the conductive line, wherein the conductive pad is thicker and wider than the conductive line;
a first conductive via structure and a second conductive via structure passing through the first passivation layer and directly connected between the conductive pad and the conductive line;
a conductive pillar over the conductive pad; and
a second passivation layer conformally covering the first passivation layer and the conductive pad, wherein the conductive pillar is over the second passivation layer and has a protruding bottom portion passing through the second passivation layer, the second passivation layer conformally covers a first top surface and a first sidewall of the conductive pad and a second top surface of the first passivation layer, the conductive pillar comprises a seed layer conformally covering a first convex curved top surface of the second passivation layer over the conductive pad,
the conductive pillar has a lower surface and a second sidewall connected to the lower surface, an angle between the second sidewall and the lower surface is less than 90 degrees,
the lower surface of the conductive pillar is a concave curved lower surface, the lower surface of the conductive pillar is connected to the second passivation layer, and the conductive pillar has a third sidewall, the lower surface is connected between the third sidewall and the second sidewall, and the third sidewall is connected to an inner wall of the second passivation layer.

2. The chip structure as claimed in claim 1, wherein the first conductive via structure and a center portion of the conductive pad are misaligned in a direction perpendicular to a top surface of the substrate.

3. The chip structure as claimed in claim 2, wherein the second conductive via structure and the center portion of the conductive pad are misaligned in the direction perpendicular to the top surface of the substrate.

4. The chip structure as claimed in claim 3, wherein the center portion is between the first conductive via structure and the second conductive via structure.

5. The chip structure as claimed in claim 1, wherein the conductive pad has a convex top surface, and the first conductive via structure and the second conductive via structure are both under the convex top surface.

6. The chip structure as claimed in claim 1, wherein the first conductive via structure and the second conductive via structure are under the protruding bottom portion.

7. A chip structure, comprising:
a substrate;
a first conductive line over the substrate;

a first passivation layer over the substrate and the first conductive line;

a conductive pad over the first passivation layer, wherein the conductive pad overlaps a first portion of the first conductive line;

a first conductive via structure and a second conductive via structure passing through the first passivation layer and connected between the conductive pad and the first conductive line, wherein the conductive pad is thicker than the first conductive via structure, and the first conductive via structure and the second conductive via structure are arranged along the first portion of the first conductive line under the conductive pad;

a conductive pillar over the conductive pad; and a second passivation layer over the first passivation layer and the conductive pad, wherein the conductive pillar is over the second passivation layer and has a protruding bottom portion passing through the second passivation layer, the conductive pillar further has a concave curved lower surface, the protruding bottom portion protrudes from the concave curved lower surface, the protruding bottom portion has a bottom surface, the concave curved lower surface and the bottom surface face the substrate, the bottom surface is closer to the substrate than the concave curved lower surface, the conductive pillar further has a sidewall connected to the concave curved lower surface, and an angle between the sidewall and the concave curved lower surface is less than 90 degrees.

8. The chip structure as claimed in claim 7, wherein the second passivation layer overlaps the first conductive via structure.

9. The chip structure as claimed in claim 7, further comprising:

a third conductive via structure passing through the first passivation layer and connected between the first conductive line and a center portion of the conductive pad, wherein the first conductive via structure, the third conductive via structure, and the second conductive via structure are arranged along the first portion of the first conductive line.

10. The chip structure as claimed in claim 7, wherein a first thickness of the conductive pad is greater than a sum of a second thickness of the first conductive via structure and a third thickness of the first conductive line.

11. The chip structure as claimed in claim 7, further comprising:

a second conductive line over the substrate, wherein the first passivation layer is further over the second conductive line, and the conductive pad further overlaps a second portion of the second conductive line; and a third conductive via structure passing through the first passivation layer and physically connected between the conductive pad and the second portion of the second conductive line.

12. A chip structure, comprising:

a substrate;

a first conductive line over the substrate;

a first conductive via structure and a second conductive via structure over and connected to the first conductive line;

a conductive pad over and connected to the first conductive via structure and the second conductive via structure, wherein the conductive pad is thicker than the first conductive line, and the first conductive via structure and the second conductive via structure are in direct contact with the conductive pad and the first conductive line;

a conductive pillar over the conductive pad;

a second conductive line over the substrate, wherein the conductive pad overlaps the second conductive line;

a third conductive via structure and a fourth conductive via structure between and in direct contact with the second conductive line and the conductive pad, wherein a first distance between the first conductive via structure and the third conductive via structure is substantially equal to a second distance between the second conductive via structure and the fourth conductive via structure; and a passivation layer over the conductive pad, wherein the conductive pillar passes through the passivation layer, the passivation layer has an inner wall surrounding a protruding bottom portion of the conductive pillar, the inner wall is over a top surface of the conductive pad, and the inner wall surrounds the first conductive via structure, the second conductive via structure, the third conductive via structure, and the fourth conductive via structure in a top view of the passivation layer, the first conductive via structure, the second conductive via structure, the third conductive via structure, and the fourth conductive via structure.

13. The chip structure as claimed in claim 12, further comprising:

a solder bump over the conductive pillar.

14. The chip structure as claimed in claim 12, wherein the conductive pad has a convex curved top surface.

15. The chip structure as claimed in claim 12, wherein the first conductive line and the second conductive line extend across the conductive pad.

16. The chip structure as claimed in claim 1, wherein the seed layer of the conductive pillar has a second convex curved top surface overlapping the first convex curved top surface of the second passivation layer, and the first convex curved top surface and the second convex curved top surface face away from the substrate.

17. The chip structure as claimed in claim 12, wherein the inner wall of the passivation layer has an oval shape in the top view.

18. The chip structure as claimed in claim 1, wherein the first convex curved top surface of the second passivation layer is connected to the inner wall of the second passivation layer.

19. The chip structure as claimed in claim 18, wherein the inner wall of the second passivation layer is connected to the first top surface of the conductive pad.

20. The chip structure as claimed in claim 19, wherein the inner wall of the second passivation layer overlaps the first conductive via structure.

* * * * *